US009449590B1

(12) United States Patent
Severson et al.

(10) Patent No.: US 9,449,590 B1

(45) Date of Patent: Sep. 20, 2016

(54) LOW FREQUENCY AUDIO SOUND EFFECTS IN MODEL RAILROADING

(71) Applicant: QS Industries, Inc., Beaverton, OR (US)

(72) Inventors: Frederick E. Severson, Beaverton, OR (US); Pat Quinn, Aloha, OR (US)

(73) Assignee: QS Industries, Inc., Beaverton, OR (US)

( * ) Notice: Subject to any disclaimer, the term of this patent is extended or adjusted under 35 U.S.C. 154(b) by 65 days.

(21) Appl. No.: 14/199,886

(22) Filed: Mar. 6, 2014

Related U.S. Application Data

(60) Provisional application No. 61/784,080, filed on Mar. 14, 2013.

(51) Int. Cl.

*H03G 3/00* (2006.01)
*G10H 5/10* (2006.01)
*H04B 1/00* (2006.01)

(52) U.S. Cl.

CPC .................................... *G10H 5/10* (2013.01)

(58) Field of Classification Search

CPC .................................................... G10H 5/10
USPC ......... 381/61, 119; 341/20, 34, 27; 307/125; 246/187 A, 4, 2, 3, 5, 1; 340/815.72, 340/815.69, 815.52; 104/296, 300, 301
See application file for complete search history.

(56) References Cited

U.S. PATENT DOCUMENTS

| | | | | |
|---|---|---|---|---|
| 7,770,847 B1 * | 8/2010 | Severson | ............... | A63H 19/24 246/1 C |
| 2004/0239268 A1 * | 12/2004 | Grubba | ................. | A63H 19/24 318/268 |
| 2014/0162528 A1 * | 6/2014 | Derby, Jr. | ............. | A63H 19/14 446/410 |

* cited by examiner

*Primary Examiner* — Vivian Chin
*Assistant Examiner* — Ammar Hamid
(74) *Attorney, Agent, or Firm* — Schwabe, Williamson & Wyatt P.C.

(57) ABSTRACT

Remote objects, which may include cars and locomotives, rolling stock and or fixed objects in a model railroad layout, convey sound and/or other digital information to a Sound and Control Centers, Local Sound and Control Units and or walk-around throttles to produce sound and operations that enhances the model train experience. Preferably, remote objects may communicate with the sound and control center by wireless means, and over separate communication channels. Sound information and related data from the separate channels can be processed, combined, enhanced or used to fetch additional sounds from memory, in order to drive at least one speaker that is separate from the remote objects. The speaker(s) may be especially advantageous to produce or enhance low frequency audio sounds coordinated with activity at the remote object(s).

12 Claims, 25 Drawing Sheets

Lenz System, the "Gap"

Present Invention, the "Drop"

LOW FREQUENCY AUDIO SOUND EFFECTS IN MODEL RAILROADING

RELATED APPLICATIONS

This application is a non-provisional of U.S. Provisional Application No. 61/784,080 filed Mar. 14, 2013 and incorporated herein in its entirety by this reference.

COPYRIGHT NOTICE

© 2012-2014 QS Industries Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71(d).

TECHNICAL FIELD

We describe methods or means for conveying sound and/or digital information by one or more movable or fixed Remote Objects on a model railroad layout to Sound and Control Centers, Local Sound and Control Units and walk-around throttles to produce sound and operation that enhances the model train experience.

BACKGROUND OF INVENTION

One of the first methods of bidirectional communication was used by Pacific Fast Mail (PFM™) for sensing the position of a steam model train drive wheel. The wheel sensor cam would produce a short circuit condition to a high frequency signal applied to the track. The PFM sound system would detect this RF short circuit condition as the drive wheel on the model moved to different positions and apply a chuff (steam exhaust) audio signal to the track which was then applied to a speaker inside the moving locomotive. This type of bidirectional communication did not use an active signal sent from a remote object (the locomotive) but rather a condition in the locomotive that was passively polled by the RF signal sent from the control system to determine the locomotives wheel position. In passive polling communication systems, the receiver of the bidirectional information sends a signal to the remote object and looks at the condition of the sending signal for information. In active polling communication, the locomotive responds to a query from the command station and responds with an active signal sent by the remote object back to the command station.

The NMRA Digital Command Control System does have a method of bidirectional communication used in Service Mode. Service Mode is essentially a programming mode where the command station can program various behavior parameters (called Configuration Variables, CV's) into the locomotive and also read out CV values stored in the locomotives decoders using Acknowledgement pulses (called Acks). Acknowledgements are performed by the decoder affecting the load a locomotive presents to the command station to indicate a single bit response to a query. For example, the command station might query a decoder if the value of a certain CV 8-bit register is "one". If there is no acknowledgement, the next query asks "is it 2". If there is no Ack the next query asks, "is it 3" and so on until it gets an Ack to confirm the value. This is a slow procedure since it may require a full 256 queries before it gets an Ack. This is a passive polling method of doing bidirectional communication.

SUMMARY OF SELECTED EMBODIMENTS

Bidirectional communication may become a very important part of the communication system between remote objects on a model train track and various receivers either at the source of track power or stationary receivers that are placed at different locations on the layout or among remote objects on the track. Some of the advantages of bidirectional communication include: 1) displaying the speed of a remote object, 2) determining the simulated or actual air pressure in brake pipes, 3) the location of a remote object on a layout, 4) the internal temperature of the remote object, 5) fuel levels, 6) motor temperature (if it has a motor), 7) electronics board temperature, 8) inclination angle or grade, 9) curvature of the track, 10) distance traveled since odometer reset.

Additional advantages of bidirectional communications may include: 11) trip odometer value, 12) total distance traveled since new, 13) total time of operation since reset or new, 14) actual or simulated maintenance condition, 15) remaining simulated or actual fuel, 16) remaining simulated or actual water in a steam tender and/or steam locomotive boiler, 17) water supply for steam heaters, 18), actual or simulated traction motor current, 19) steam boiler pressure, 20) actual or real wheel slippage conditions, 21) remaining actual or simulated sand for traction, 22) open or closed condition of couplers, 23) stress of loading on drawbar, 24) the physical motion of the remote object such as bumps or side to side motion, 25) remaining smoke fluid or water in the simulated smoke or steam generator, 26) the conditions of various lights or actual or simulated appliances, 27) tractive force, 28) model's electric motor power and current, 29) track voltage, 30) digital packet reception errors, 31) bi-directional transmission errors, 32) radio communication from simulated or actual crew, 33) talk among real or simulated crew members, 34) track side actual or simulated detector reports, 35) ambient lighting conditions (such as day or night, tunnel, bad weather), 36) actual or simulated diesel notch positions, 37) simulated or actual traction motor current, 38) diesel transition setting, 39) generator voltage, 40) diesel motor RPM, 41) train accident sounds or report, 42) grade crossing alert, 43) actual or simulated prime mover operating conditions, 44) locomotive cab number, 45) locomotive train number, 46) DCC loco and consist ID numbers, 47) programming behavior settings (analog or command control), 48) remote object sounds (from sound system or from internal or external mounted microphones), 49) video signals (from internal or external mounted cameras), 50) GPS data (from local or actual global positioning systems), 51) queries and data from trackside transmitters or transceivers, 52) scheduling conditions (on-time, behind schedule, etc), 53) time check of actual or simulated time (fast-time), 54) load conditions, 55) actual or simulated Steam Cutoff setting or Johnson bar position, 56) actual or simulated conductor crewman communications, 57) actual or simulated train order verifications, 58) actual or simulated track condition reports, 59) actual or simulated dynamic brake condition and level setting, 60) routing reports (such as when a turnout is changed), 61) fuel pressure, 62) etc.

Bidirectional communication is an important part of the emerging technologies of train control where computers automatically control the speed, direction, etc. and the routing of model trains. To know where a particular locomotive is and its present status allows the computer to make the necessary decisions to properly direct different trains to their locations while preventing collisions and maintaining schedules.

FIG. 1 shows a block diagram of five common modules used in some embodiments along with multiple means of communication. The modules include a control center, 130, a power district, 120, for powering selected portions of the track, multiple hand held throttles, 111 and 112, two remote module, one without sound capability, 100, and one with sound capability, 140. The remote objects can either be stationary or mobile on the track system.

All modules are shown connected to the standard system bus, 161, for bidirectional data communication. Modules are each shown with RF radio link transceivers, 121, 131, 133, 102, 142, and optional RF transceivers are shown in hand held throttles 110, 112. These RF radio links can be can be of many types Blue Tooth, IR, WiFi, or even hardware tethered direct links. Preferred transceivers will be bidirectional. The RF transceivers are optional and, if used, can serve the same function as the standard system bus, 161, since the RF transceivers connect all modules together on a common communication system. The choice of including RF links may depend of the choice of scale. For instance, communication via a common bus may not be the best choice for G' Gauge, particularly if the locomotive remote modules are powered by on-board batteries; in this case, Blue Tooth, WiFi, Infrared or other RF type links may be a better choice. For smaller gauges, RF modules may be too large to be practical. Still, RF type links may be retained between walk-around throttle control centers like 120 and 130 to provide mobility of operation around the layout.

A third addition to this communication system is a new type of bidirectional DCC which can be applied to the track and used as a general communication medium for any modules connected to the track system. Since DCC is limited in data bandwidth, a separate DCC system is added called "Q-Link" with allows accessories to be included without burdening the basic DCC system. Q-Link is designed for local accessories and may be configured separately for each power district. Q-Link, like our DCC system will be bidirectional with its own transceivers, shown as 162, 164, 103 and 147.

One embodiment for Q-Link would be to make it part of a model train sectional track system with its own hidden Q-Link bus conductor. This would allow accessories like turnout switch machines, trackside signals, water towers, passenger stations, loaders and unloaders, etc. to be easily connected to any track that had access to the Q-Link bus. The use of a DCC Q-Link is preferred for many accessories that have already been designed for use with DCC commands. The added bidirectional capability should not interfere with these legacy accessories.

Another communication innovation is a method to transmit back analog sound samples from remote objects by monitoring its load applied to the track at the control center 130 or more likely by power district modules like 120. Not only will this method retrieve sound data from one remote object but will retrieve the sum of sounds of all remote objects within the power district. The retrieved sounds can be used in track side base speakers to fill in the base components that are not sufficiently produced in the model. Also retrieved sounds can be used to create cab sounds back at the control system or for user headphones, such as 113 and 111. This method of retrieving sound samples from remote objects, called BackWave Sound, is described later in this document.

A forth addition to this communication system is a method to locally generate commands to remote objects on a track section by modifying the local DCC track waveform. Local commands are important in model railroading to stop trains at specific locations for track side signals, passenger stations, increasing or decreasing grades, indicate specific location markers, provide data from track side detectors, etc. The method is described later in this document.

All models, 100, 120, 130 and 140 include a microprocessor (μP), and hardware capability designated at HW, and is shown as 109, 165, 167 and 168. The hardware defines mechanical and electromechanical features under microprocessor controller for each module and can include such functions as motor controls, solenoids, lights, displays, smoke and steam generators, actuators, proximity detectors, bi-directional LED transceivers of embedded track transceivers, accelerometers, inclinometers, speed detectors, calibrated track loading under certain conditions, etc.

One of many mobile or fixed Remote Objects, 140, includes System Data and Sound Processor, 141, which contains stored sound and/or sound related information, long term erasable memory, and firmware for communications, sound processing and operating the Remote Object. The System Data and Sound Processor, 101, can include actual sound data such as full or partial digital sound files, real time or pre-processed sound files, and sound information such as file length, sample rate, dynamitic range, volume scaling, etc. In addition, ancillary information relevant to sound reproduction in the model railroad environment such as the location of the remote object, speed of the object (if mobile), Identification (ID) Number, or other information about the state of the remote object is also stored in the System Data and Sound Processor, 101.

Remote Object, 140, also includes one or more Sound Production Channels such a, 143 and 145, along with speakers 144 and 146. Two or more sound reproduction channels provide considerable advantages for Remote Object sound systems. If they are part of a locomotive sound decoder, the speakers can be placed in different areas of the locomotive and/or tender to produce sound appropriate to their locations. For instance, if the model were of a prototype locomotive that had two prime movers (e.g. diesel motors) of the same motor type, separate speakers placed apart in a model could simulate independent sounds for each prime mover. Even in small scales, the separation of the two diesel motors into two independent speakers makes a signification difference in the quality of the sound. Often, models are produced where two similar prime mover sounds are both summed into one speaker channel which unfortunately sounds more like a single noisy motor. In addition, prime mover sounds can be directed into two separate coupled locomotives to reduce the cost of having both locomotives equipped with full sound systems.

Other sounds that commonly occur in different areas of a prototype locomotive, such as sounds of opening and closing a front diesel cab door, radio cab chatter from the cab, front coupler opening or closing, rear coupler opening or closing, steam generator sounds for passenger diesels at the rear of a locomotive, etc. can by simulated in the model by having the sounds emanate from different speakers. In steam locomotives, additional sound reproduction channels allow local tender sounds such as water and coal, wood or oil loading. Two or more channels can simulate moving sounds such as crewmen walking along the track and/or talking outside of a locomotive, maintenance work on different areas of the locomotive such as different diesel trucks, brakeman changing a turnout, walkie-talkie communication such as between brakeman and engineer, etc. It would, in fact, be desirable to have four separate sound channels available for the larger scales such as O'Scale and G'Scale; for instance, for diesels, speakers at each end of the locomotive for locations specific sounds of cab, couplers, radio com, passenger steam heat boiler, etc., a speaker in the roof area for horn, fans, dynamic brake sounds, etc. a speaker in the fuel tank for sounds of traction motors, bells, generators, pumps, fuel and water loading and maintenance sounds, etc.

More than one channel can also provide better sound acoustics for steam locomotive models. For instance, a small speaker could be placed in the model's boiler near the steam chest under the stack where the steam exhaust (chuff) would normally be heard and a large base speaker placed in the tender for low frequency response. Since the human ear is not as able to determine the location of low frequency sound, a listener would believe that all the chuff sounds were coming from the boiler speaker, even though this speaker is not producing the full frequency response.

Fixed Remote Objects such as environmental sound modules that are designed to produce local sound effects could also benefit from multiple sound channels. For instance, sound of a downtown city area could simulate the sounds of cars, trucks, police car with sirens moving down streets. Airport sounds could also include simulation of moving planes taking off or landing. Waterfront sound models could include simulated sounds of moving boats and seagulls. Environmental sound units would like be controlled directly through local Q-Link bus.

Remote Objects, 100 and 140, System Data and Sound Processor, 101 and 141, can include general purpose microprocessors or custom processors, RAM, ROM, and non-volatile memories, Analog to Digital Convertors, Digital to Analog Convertors, Firmware, power supplies, rectifiers, signal detectors, etc. Besides polyphonic sound data generation and other sound related processing, they may also control other functions in the remote object such as motor control, speed control, lighting effects, smoke generators, turnout control, communication parsing and decoding, and other functions common to model trains. Remote Objects, such as 100 and 140, can communicate through common bus, 161, if connected to their respective System Data and Sound Processors, such as 101 and 141.

The Remote Objects can also include means to provide selected information via their Transceiver Means, such as 102 and 142, to other Transceiver Means, such as 121 and 131, which are part of Sound and Control Center, 130, and Local Sound and Control, 120, or Walk-around throttles such as 110 and 112. Sound and Control Center, 130, is one of many possible Sound and Control Centers on the layout, and Local Sound and Control, 120, is one of many possible such units dedicated to local district power or control on the layout. One advantage of using RF or WiFi transceivers on remote objects such as model locomotives is that video can be transmitted more reliably to the control center or even directly to walk-around throttles that have display screens; this would allow viewing of images made by miniature cameras on the model locomotives. Audio could also be transmitted along with the video for both sound and sight from the point of view of the miniature engineer inside the model cab. Smart phones and tablets configured to WiFi reception and transmission can also be configured as both controlling means and video and audio display means for model trains.

Sound and Control Center, 130, includes Sound Data and Sound Processing Means, 122, which includes data processors, memories, firmware, etc. for parsing and decoding sound and sound related data from the Transceiver, 131, Q-Link transceiver, 164 or bidirectional DCC signals from 129.

Sound and Control Center, 130, can include Layout and Control, 134, which provides signaling and/or digital commands to the layout, 136, to affect Remote Objects such as locomotives, turnouts, rolling stock, environment sound modules, accessories, loader and unloaders, uncouplers, layout lighting, other Sound and Control Centers, Local Sound and Control such as 120, power blocks or power districts, and other features common to model train layouts. Computer control of trains via Personal Computers (PS) or dedicated data processes can also be part of the Sound and Control Center, 130, and control line 161 can include common digital buses for the control of the different features and functions mentioned above.

Local Sound and Control, 120, is similar to Sound and Control Centers such as 130, except it is designed to provide local sound effects and control and will usually also include local Layout and Train Control, 123. For instance, 130 may include local block control or local NMRA DCC power district control of locomotives turnouts, rolling stock, environment sound modules, accessories, loader and unloaders, uncouplers, layout lighting, and other remote objects. Local Layout and Train Control, 123, can accept or send commands via control bus, Q-Link, 160. Although sound control is local for 120, sound information or commands can also be conveyed back and forth between any number of Local Sound and Control Units and Sound and Control Centers via Standard System Bus, 161.

Both Sound and Control Centers, such as 130, and Local Sound and Control, such as 120, contain sound reproduction means. For the Sound and Control Center, 130, there can be one or more sound reproduction channels such as 137 and 139. Speakers, 138 and 140, produce sound from Sound Production, 137 and 139 respectively. For Local Sound and Control, 120, sound reproduction channels, 125 and 127, power speakers, 126 and 128 respectively. The different Sound Production channels can be used to provide stereo or spatial effects or can be used to provide simulated moving sound effects. This can be useful when speakers are placed near track or other areas where a mobile Remote Object may operate. To simulate moving sound that is coordinated with the moving object, sound can be varied smoothly from one speaker to the other. Other speakers can be placed in different or more remote areas to provide echo and reverb effects. If it is necessary to simulate sound moving over a great distance on a model train layout, the sound can be moved smoothly from one Local Sound and Control unit to the next by sending sounds and commands via bus 161.

Both Sound and Control Centers, such as 130, and Local Sound and Control, such as 120, may have means, 133, for communication between any number of hand held transceiver walk-around throttles such as 110. Walk-around throttles, such as 110, may also contain means to reproduce sounds via a built in speaker, ear buds, or headphones, 111. Sound and/or sound information can be conveyed by Sound and Control Center, such as 130, to the walk-around throttle via transceivers, 133 or 131 and by Local Sound and Control units such as 120, using transceiver, 121. In addition, sound and/or sound information can be conveyed directly from remote objects, such as 100 or 140, via their transceivers 102 and 142.

Sound and sound related information can also be available for model train remote control systems that communicate directly to remote objects from fixed or hand held throttles such as the walk-around throttle, 112. In this case, sound and/or sound information is communicated directly between throttle, 112 and remote object's, 100, transceiver, 102, and remote object's, 140, transceiver, 142. Sound can be reproduced through the Walk-around throttle built in speaker, ear buds, or headphones, 111 and/or 113. In addition, microphones can be included as part of walk-around throttles 110 and 112 to allow users to communicate with each other or the dispatcher in large layouts.

Means of providing information to Transceiver Means, 121 and 131, from Remote Objects, such as 100 and 140, can include radio frequency transmission, Infrared or Visible light transmission, direct sound transmission, transmission down the layout railroad track or cables connected directly or indirectly from the remote objects to the Transceiver Means, 121 and 131. Indirect transmission might include first conveying information to the model railroad track, through remote object's electrical connection to the track and from the track to the transceiver means, 121 and 131, or conveyance to local receivers or detectors of one type of signal and then forward to the Transceiver means, 121 and 131, by the same or one or more alternate transmission means. For instance, Remote Object, 140 may transfer information to remote object, 100, through transceiver means, 103, to a local power district controller, such as 120, which in turn conveys information to the central control module, 130, which sends out a global DCC signal through 136 to the layout which is received by Transceiver Means, 147 for remote object 140. As an example, suppose the lead locomotive in a long train with mid-trail helps and pushers receives a local track side signal to stop at a red signal. The lead locomotive in turns sends a command via DCC bidirectional communication to local power district controller, 120, which in turn tells 130 about the need for the train to stop, which then sends out a global throttle signal that applies to all locomotives in the train. This prevents any locomotive from getting having different throttle commands that can cause derailments. In addition, the lead locomotive can send back continuous information about its position and speed so the control center, 120, that can allow 130 to update the stopping action of the train to stop where it should. If modules are equipped with RF links, these links could convey information between remote objects directly.

Both Sound and Control Centers, such as 130, and Local Sound and Control, such as 120, have USB inputs that can be connected to PC's and/or the internet. PC can facilitate programming behavior parameters such as NMRA CV's, downloading new sounds, operations in service mode, etc. Personal Computers can be used to program the operation of trains through the Control Center and Local Sound and Control district modules to route trains, perform basic signaling functions, automatic switching, speed control, collision avoidance, fast time, coordinated environmental sounds and lights such as night and day effects, etc. In addition, access to the internet and the availability of local cams and locomotives with on-board cameras can allow other model train enthusiasts to log on locally and control other layouts that provide this kind of service.

One advantage of some embodiments is to produce a completely integrated sound and control environment that can supply sound, and/or sound records and/or sound related information directly from Remote Objects back to Sound and Control Center (such as 130), Local Sound and Control Units (such as 120) and/or to walk-around throttles (such as 113), to provide bidirectional DCC information from mobile remote objects, to provide a way for local accessories to be integrated into the global control system via the Q-Link connection, to provide means for commands to be sent to mobile remote objects that venture into local areas, a way for one remote mobile device to communicate to other remote devices, particularly if they are all part of the same train, a way to track the location and speed of individual trains via their odometers and knowledge about their positions when they enter different locals and the positions of turnouts, ways to allow PC control of the entire train environment, access to layouts from users via the internet and a track system that allows easy connection to local accessories via a simple DCC system auxiliary bus like Q-Link.

In particular, sounds provided from remote objects via the DCC BackWave sound can be used to reproduce sounds or enhance sound already produced or stored by Remote Object or sound information can be used to coordinate operation and sounds produced by Remote Objects with sounds stored and produced by Sound and Control Center and/or Local Sound and Control units. For instance, the base sounds stored in Remote Objects but reproduced poorly by the Remote Object's audio system and limited acoustics can be enhanced by reproducing the base sounds by Sound and Control Centers, Local Sound and Control Units, and/or walk-around throttles where better control of lower frequency sounds are available. These sounds can be added without affecting the perception that the sounds are coming from the Remote Object since the source location of low base sounds cannot be easily detected by human sound perception.

Some embodiments disclosed herein can also be used to produce simulated sounds appropriate for moving model locomotives by transmitting from the model sound information such as the acceleration and simulated and real load, notch setting in diesels, speed, steam exhaust (chuff) triggers and cutoff settings for steam locomotives, direction, local terrain such as tunnels, cuts, open area, travel over turnouts or crossovers, grades, etc. that can all affect the modeled sound effects. In this manner, the sounds produced by the Sound and Control Centers, Local Sound and Control Units and/or walk-around throttles can be coordinated to the operation and/or sounds of the locomotives. In addition, sounds and/or sound information from many different locomotives can be used to produce combination sounds from the different locomotives in consists.

Another example is to provide sound related information or reproduce the sounds from Remote Objects to simulate sounds appropriate for the interior of a locomotive cab. This provides an enhanced and more realistic experience for the model train user that is operating the cab controls of his locomotive. Depending on the type of sounds or sound information available, the sounds can provide valuable feedback about the operation of his Remote Object such as sounds that reflect how hard a locomotive is working, how fast it is going, its surroundings, etc. Other sounds can be added by at the cab controls such as radio communications by the dispatcher or by other operators or local sounds appropriate for the current location of the Remote Object such as automobile traffic sounds, factory sounds, police sirens, crossing gate bells, barking dogs, rail fans, other passing trains, etc. and Doppler shift effects could be added as a extra features. In other words, cab sounds would not be Doppler shifted but outside sounds would be Doppler shifted according to the speed information provided by the Remote Objects. Echo and Reverb, which is difficult to produce on-board the locomotive could be reproduced via environmental stationary remote object sound objects. Since this system can determine where a locomotive or train is located and can retrieve sounds via BackWave technology, these sounds can be delayed and recombined to produce echo effects and reverb appropriate for tunnels and cuts.

The transceivers communication technologies used in different embodiments may affect the capabilities and limitations of such embodiments, for example, as summarized below.

Radio Transmission

Using Radio Frequency Transceivers such as RF, Blue Tooth, and WiFi can provide means for each Remote Objects to communicate with Sound and Control Center, Local Sound and Control Units and/or walk-around throttles. In order to prevent different Remote Objects RF transceivers from interfering with each other, it would be necessary to either have each transceiver tuned to different frequencies or develop a protocol that only allowed only one to communicate at a time. If the intention is to send continuous sound from each remote object and to have all of the different sound sources reproduced in part or in whole by the Sound and Control Center, Local Sound and Control Units and/or walk-around throttles, then it would easier if each remote object communicated on its own individual RF channel. In this case each received and detected transmissions from all Remote Objects would be applied to the Sound data and Sound Processing Means for sound processing. For instance, if there are many locomotives in a consist and each is producing sound and transmitting sound to the Local Sound and Control unit, then these sounds can be processed together and summed to provide production of all the sounds from the remote objects.

FIG. 2 shows two Remote Objects, locomotives 201 and 202, which at least include the elements shown in FIG. 1, 100 or 140. In the case of locomotives, 201 and 202, the transceivers are Radio Frequency units transmitting at carriers F1 and F2 respectively which are received by antenna 206, connected to Local Sound and Control unit, 204. Local Sound and Control, 204, transceiver, 205, is indicated by a group of "n" individual transceivers, each tuned to a different frequency F1 through Fn or each locomotive could use WiFi or similar modular transceivers already configured to deal with multiple transmitted data sources. The vertical double dots indicate numerous individual transceivers not shown in the transceiver group, 205. The Local Sound and Control, 204, is shown connected to the block or power district track, 203. Local Layout and Control by the Local Sound and Control, 204, can include power and/or bidirectional digital commands for operating locomotives and other Remote Objects.

In this example, Remote Object, 201, is transmitting Sound and Sound Related Data on the F1 frequency carrier to be received by antenna, 206, detected by the F1 Transceiver in the Transceiver Cluster, 207, and applied to Sound Data and Sound Processing Means, 208. At the same time, Remote Object, 202, is transmitting Sound and Sound Related Data on the F3 frequency carrier to be received by antenna, 206, detected by the F3 Transceiver in the Transceiver Cluster, 207, and applied to Sound Data and Sound Processing Means, 208, at the same time. If both locomotives are sending sound samples then these can be processed and summed by 208 and delivered for real time sound production of sounds produced in the two locomotives.

The advantage of RF transmission over sending sound samples and sound related data down the track from mobile Remote Objects like locomotives is that it avoids loss of the sound data signal when contact is lost between track and locomotive wheels or pickups. Its disadvantage is the cost and complexity of having each locomotive transmit on its own individual carrier frequency and the necessity of having multiple transceivers in the Sound and Control Centers and Local Sound and Control units. In addition, the sounds may not be restricted to a local area since RF may carry to other Local Sound and Control units in other locations. Also, since the locomotives are moving, there is unpredictable signal strength at Local Sound and Control Units or Sound and Control Centers as RF is reflected off different surfaces.

Other methods of transmitting sound and bidirectional data include light such as Infrared that can be picked up locally by LED receivers. Problems with light include some of the same problems with radio waves: 1) light can be blocked by obstacles on the layout, 2) light can be accidentally received in adjacent block receivers, 3) data must be encoded and transmitted so there is no interference from different remote objects, etc.

Sound Transceivers

Sound Transceivers made up of special microphones and speakers could transmit and receive sound and data. For instance, another way that base sounds can be enhanced from remote objects is to pick up the sounds from local microphones and amplify the diminished base sounds and reproduce them locally from stationary base speakers. While this would help fill in some of the base components, it will always be limited by how much base content can be present in the remote object speakers.

Remote object sounds and data could also be transmitted on a supersonic carrier to other stationary or remotely located microphones and detected. The remote object would need special supersonic speakers to transmit the carrier signal. However, this method also has the problem of separating the different sound sources from multiple remote objects that are picked up by other sound transceivers.

Simultaneous Sound Sources

Another way to add in missing base components from the remote object speaker is to produce simultaneous sounds from both the remote object and local sound reproduction sources using identical sound records. This way the limitations of the remote object speaker are filled in with local identical sound sources through large stationary base speakers. The one problem with this technique is to keep the simultaneous sounds in sync which will require sound control data from the remote object to trigger the same sounds in the local stationary amplifier and base speaker. For instance, if both a model steam locomotive (remote object) and a stationary sound reproduction system had identical steam exhaust records (Chuffs), a trigger to produce a chuff sound could be transmitted by the remote object to the local amplifier to trigger its chuff sound at the same time. One of the advantages to identical sound sources in the remote object and a stationary sound reproduction system is that full high fidelity sounds could be produced and modified at the control center to simulate sounds heard in the locomotive cab.

Transmission of Bidirectional Sound and Data Down the Track

Using the track to provide bi-directional data is appealing since the track system already exists on the model train layout that connects the control center to each remote or stationary object. The biggest problem with any new method of transmitting data and sound on the track system is the existing standards that already exist for model train communication. Any new data transmission techniques would preferably be an extension of and compatible with existing technologies.

The four main popular track communication technologies are: 1) Analog DC, 2) Analog AC, 3) NMRA DCC Command Control, 4) TMCC (Train Master Command Control)

for AC power track systems, and 5) MTH DCS (Digital Command System). Both analog methods use variable voltage to control the speed or power delivered to locomotives and for the most part lack any kind of commonly accepted bidirectional communication. As method previously, the NMRA DCC command control uses acknowledgement pulses in their programming to determine the digital content of special decoder registers called CV or Configuration variables. There is also a proprietary bidirectional system developed by the Lenz Company for operation mode but is not available to all users. Lionel's TMCC uses radio transmission down the track to send digital commands to receivers in remote and stationary objects but does not offer any kind of bi-direction control system. MTH's DCS does offer a high frequency carrier method for transmitting both data and sound to their locomotives and a bi-directional technology for receiving data from remote and stationary objects.

The Lenz system is the most interesting since it is an extension of the NMRA system and for the most part does not interfere with normal DCC operation. Briefly, the Lenz technique reduces the track voltage to zero for brief periods as shown in FIG. 3, which are short enough that the decoders in the locomotives remain powered from their internal power supply filter capacitors. During these zero voltage periods, called the "Gap", 301, the decoders transmit current pulses down the track to stationary receivers to detect digital information. No DCC commands can be transmitted to the decoder during the Gap period. Since DCC decoders have standard bridge rectifier inputs, the impedance on the track is essentially zero during these periods. The bidirectional current sensing at the command stations and the current from the decoders are so designed that voltage produced on the track do not exceed the turn on voltage for the decoder bridge rectifiers.

BRIEF DESCRIPTIONS OF THE DRAWINGS

FIG. 1 is a block diagram showing the various means of controlling, powering, sound reproduction and communicating between remote and stationary objects in model railroading.

FIG. 2 describes how radio transceivers can be used to communicate data and sound between objects in a model railroad and in particular the limitations of using these techniques.

Figure 19:
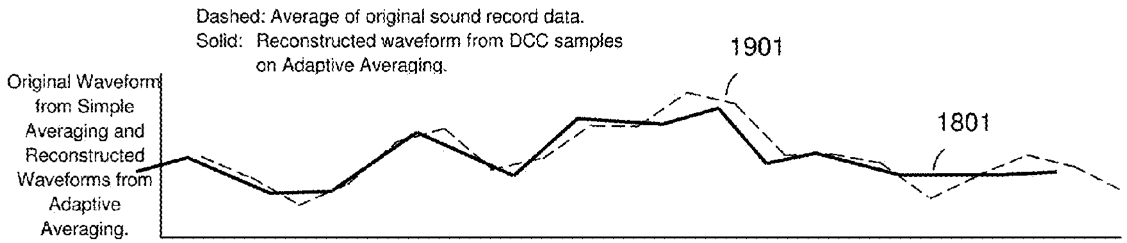

FIG. 19 compares reconstructed sound waveforms from polling of adaptive averaging of original data over epochs of polling and its adjacent non-polled periods to averaging the original sound data over the same epochs.

Figure 20:
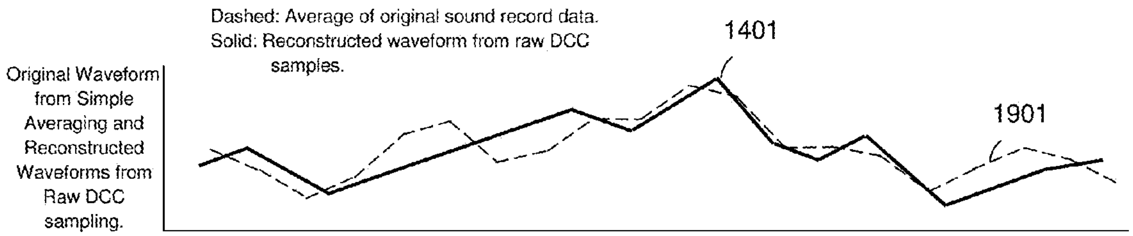

FIG. 20 compares reconstructed sound waveforms from averaging raw DC polling data to averaging the original sound data over the same epochs.

Figure 21:
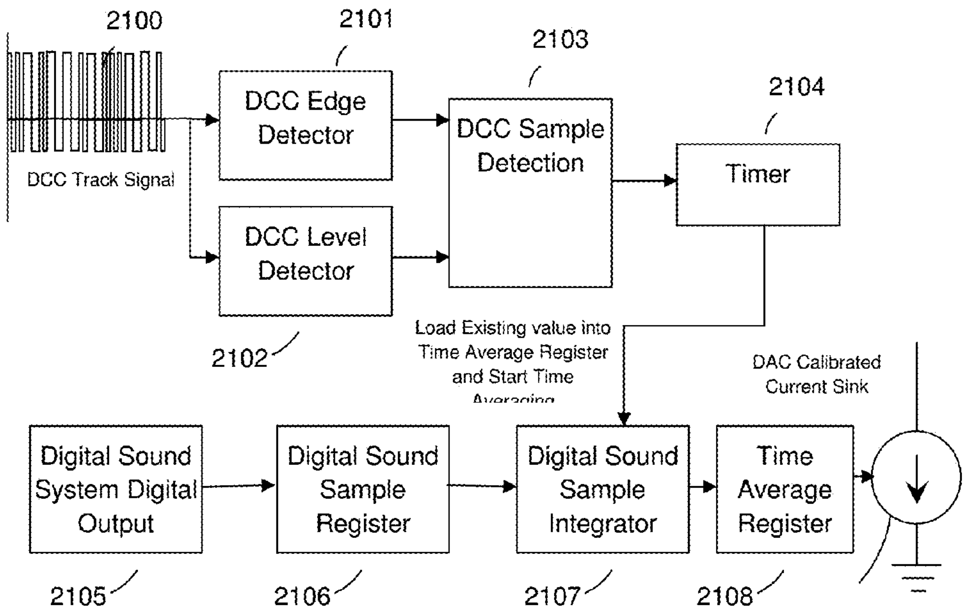

FIG. 21 shows a block diagram of a method for doing Adaptive Averaging in the decoder.

Figure 22:
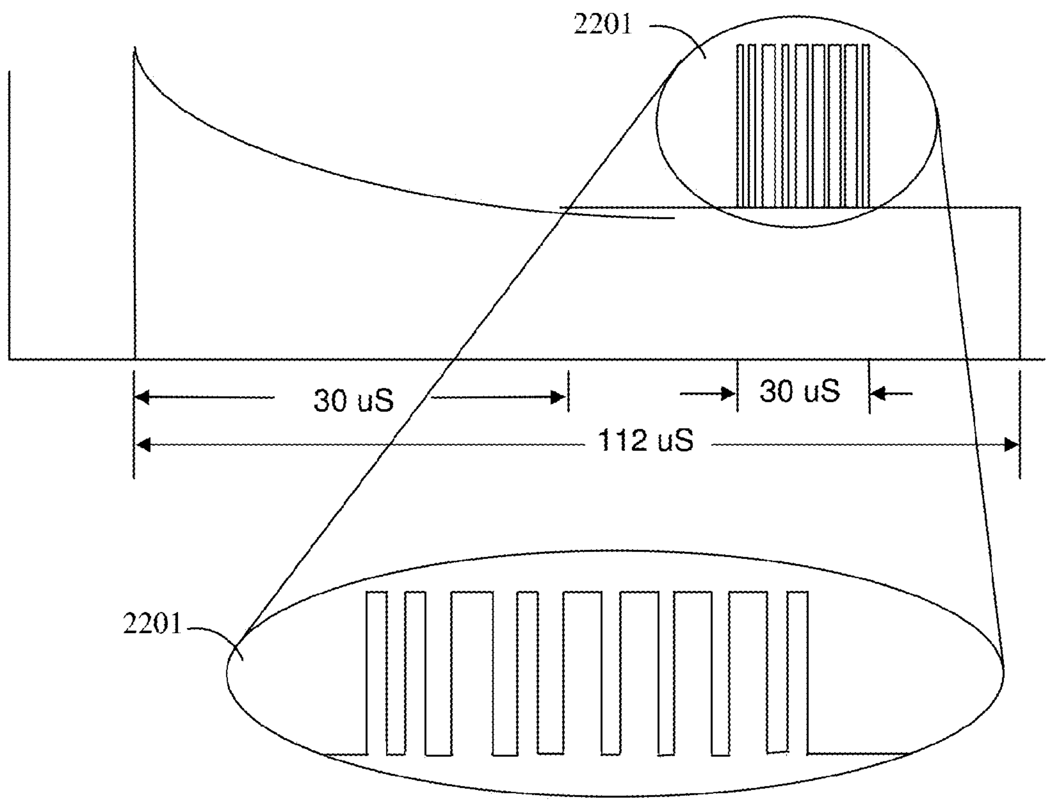

FIG. 22 shows how digital data can be embedded in the bidirectional analog sound waveform to provide both bi-directional digital data and BackWave sound.

Figure 23:
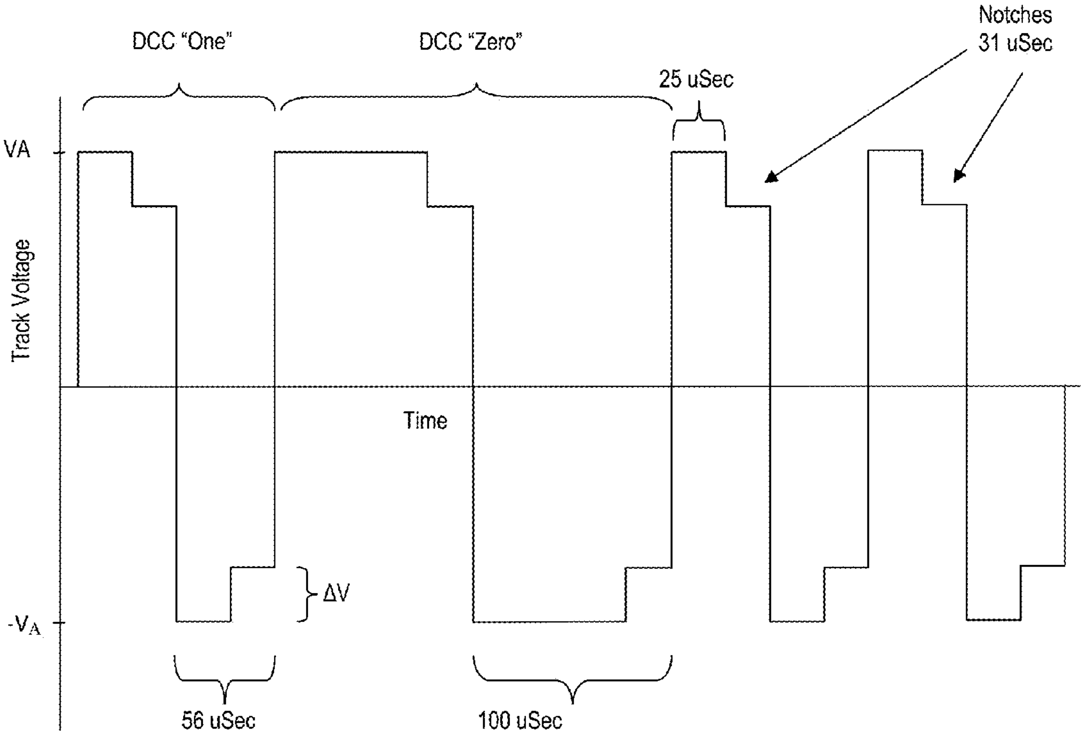

FIG. 23 shows a notch Drop applied at the end of either a DCC one or zero.

Figure 24:
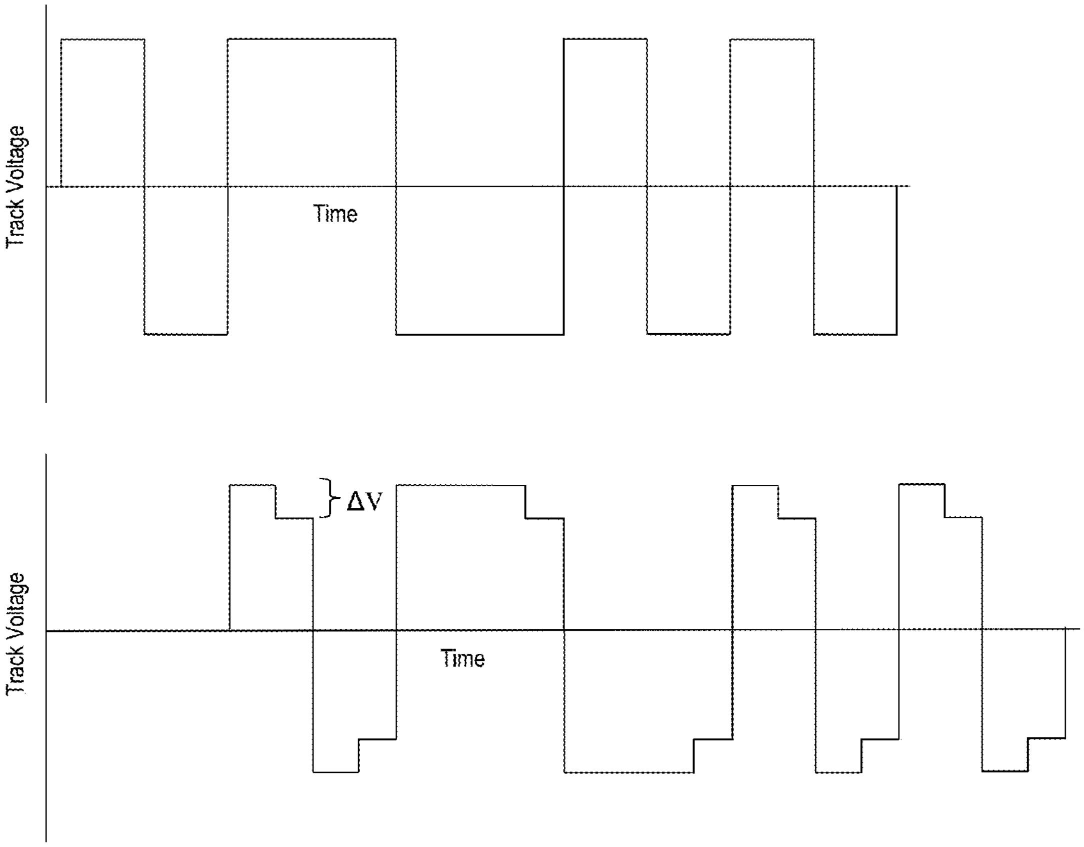

FIG. 24 shows that to create a 25 uS notch in the output of our booster, the DCC with notch would be delayed from the original DCC waveform.

Figure 25:
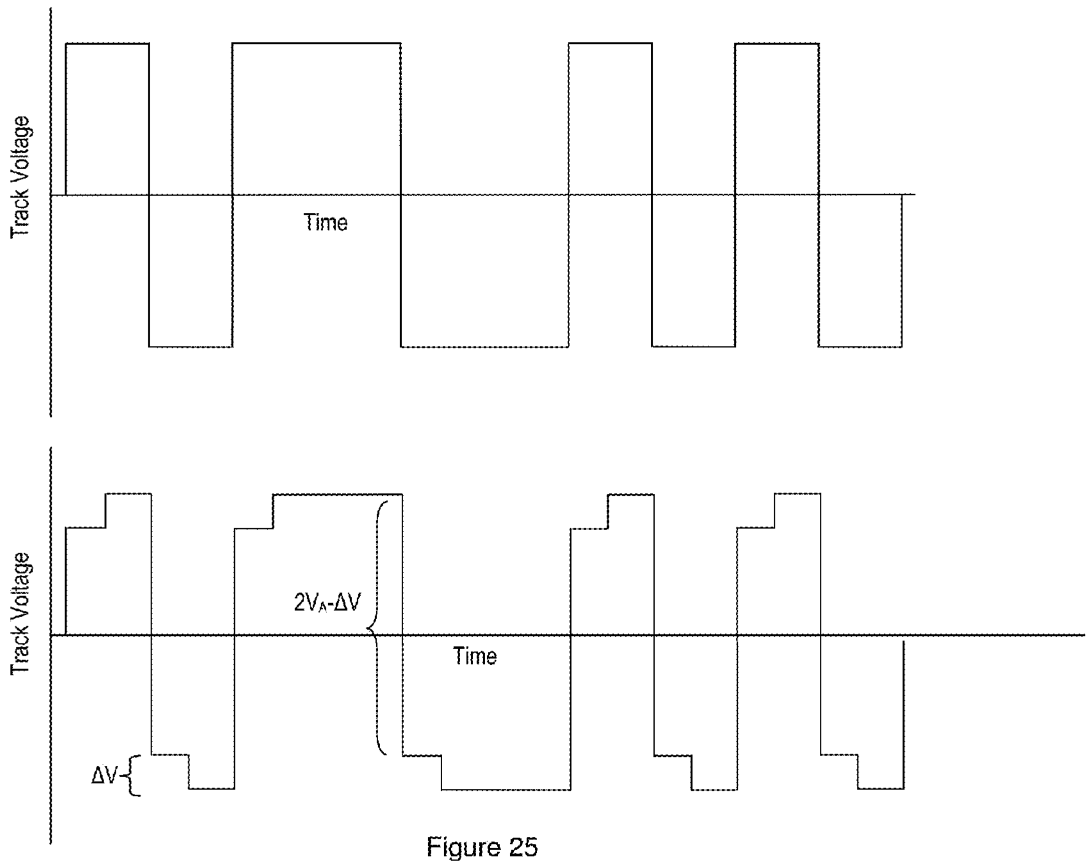

FIG. 25 shows the original DCC waveform and its reconstruction by the QSI Booster where the notch is on the leading edge and its concurrent problems with settling time at the beginning of the notch.

Figure 26:
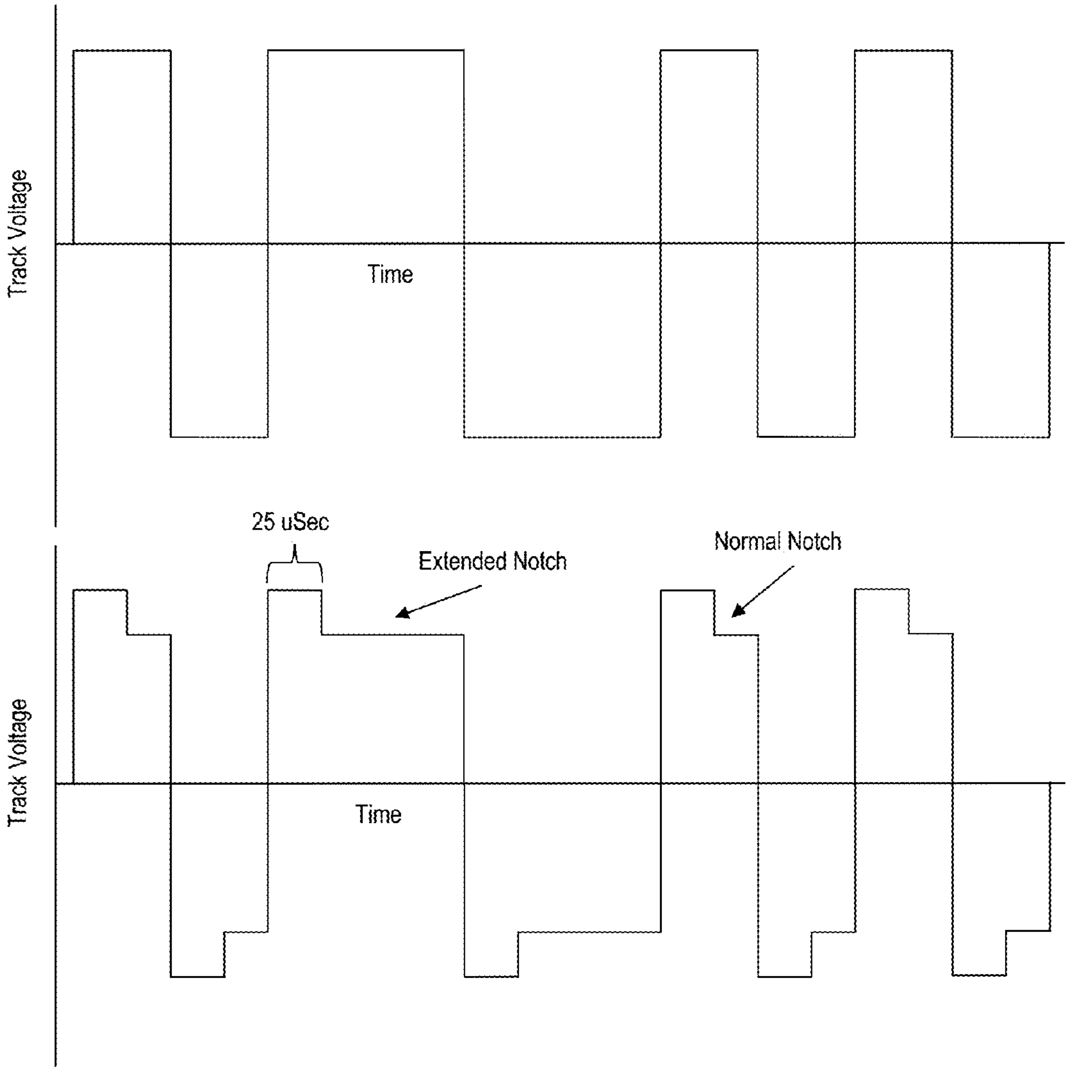

FIG. 26 is a solution to the delay problem with a notch on the back of the DCC pulse by always starting the notch 25 uSec after the start of the pulse.

Figure 27:
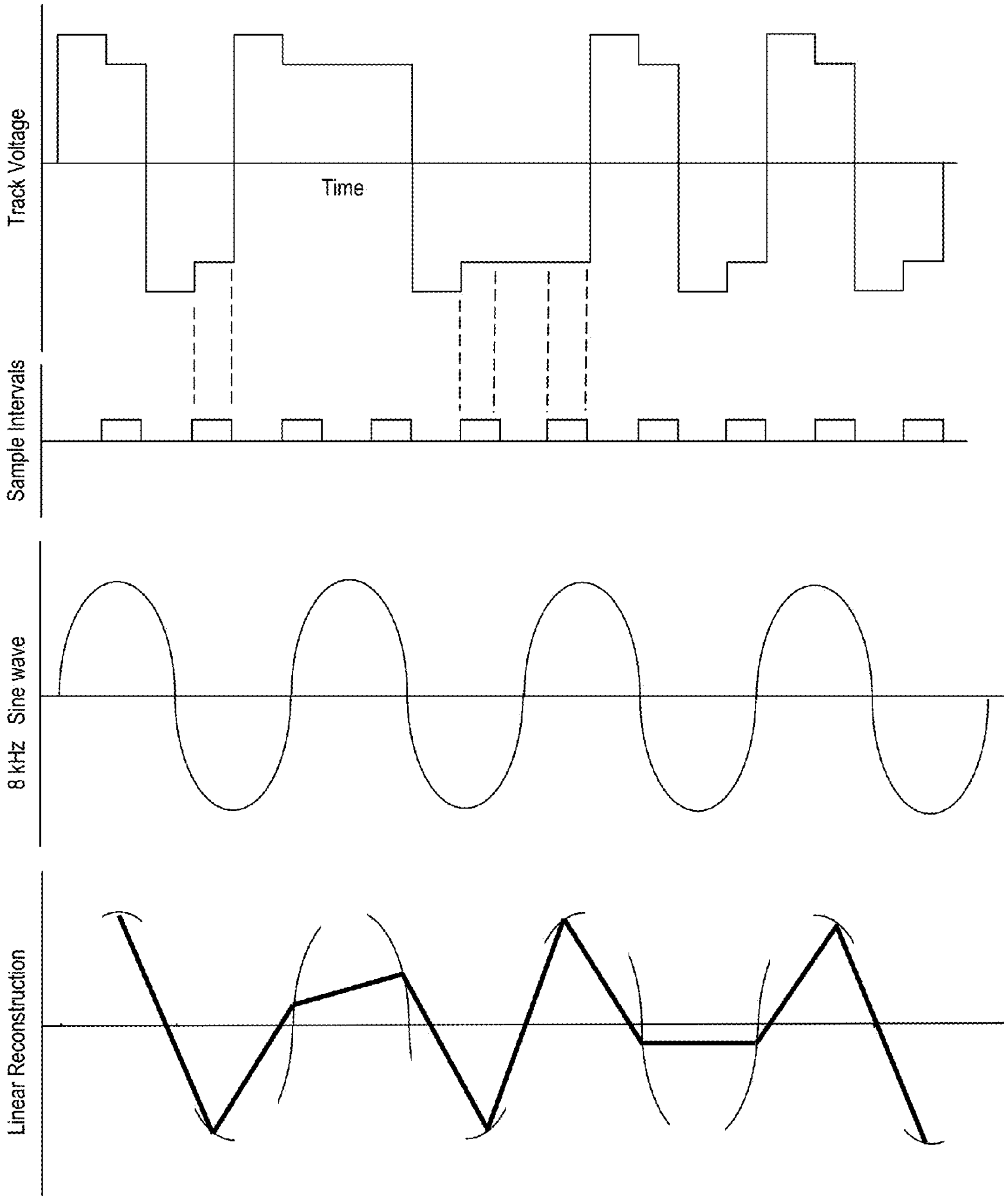

FIG. 27 shows the advantage of a 25 uS delay before Dropping to the notch that provides much more evenly spaced sample times. An example shows polling a high frequency sine wave at Nyquest and noting its reconstructed polled waveform.

Figure 28:
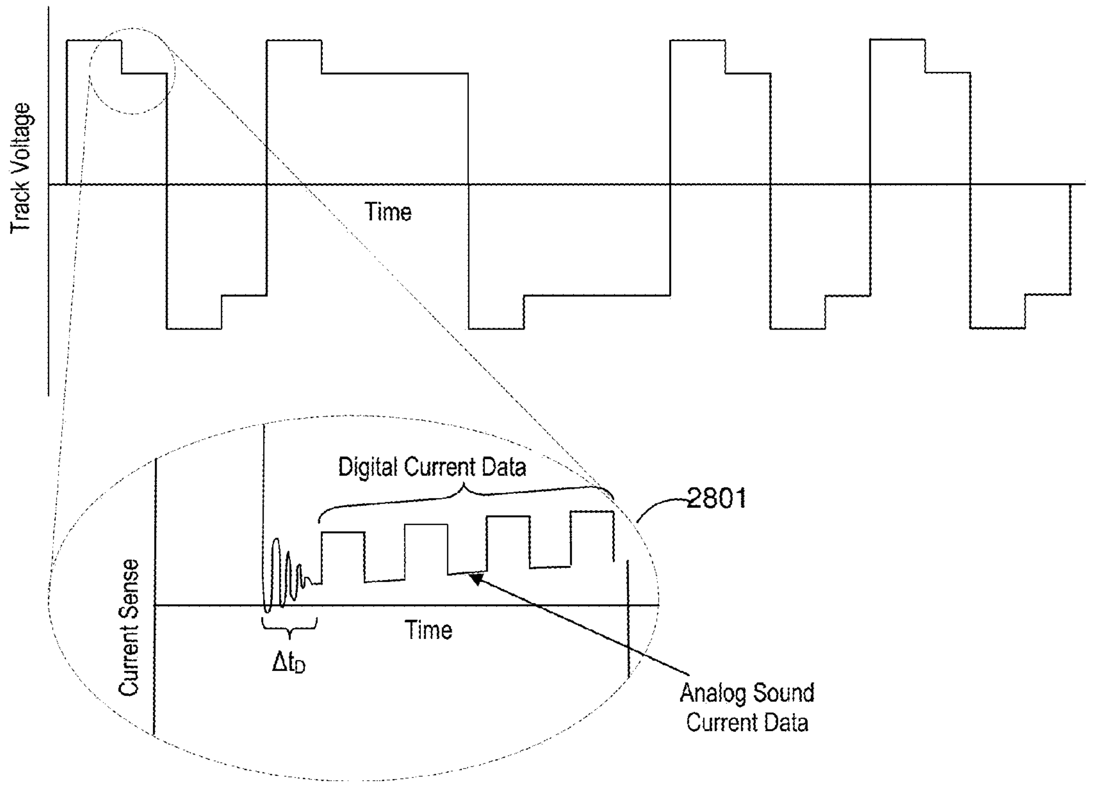

FIG. 28 shows the ringing and settling time when the Drop occurs on the waveform where the notch is on the back side of DCC pulse waveform.

Figure 29:
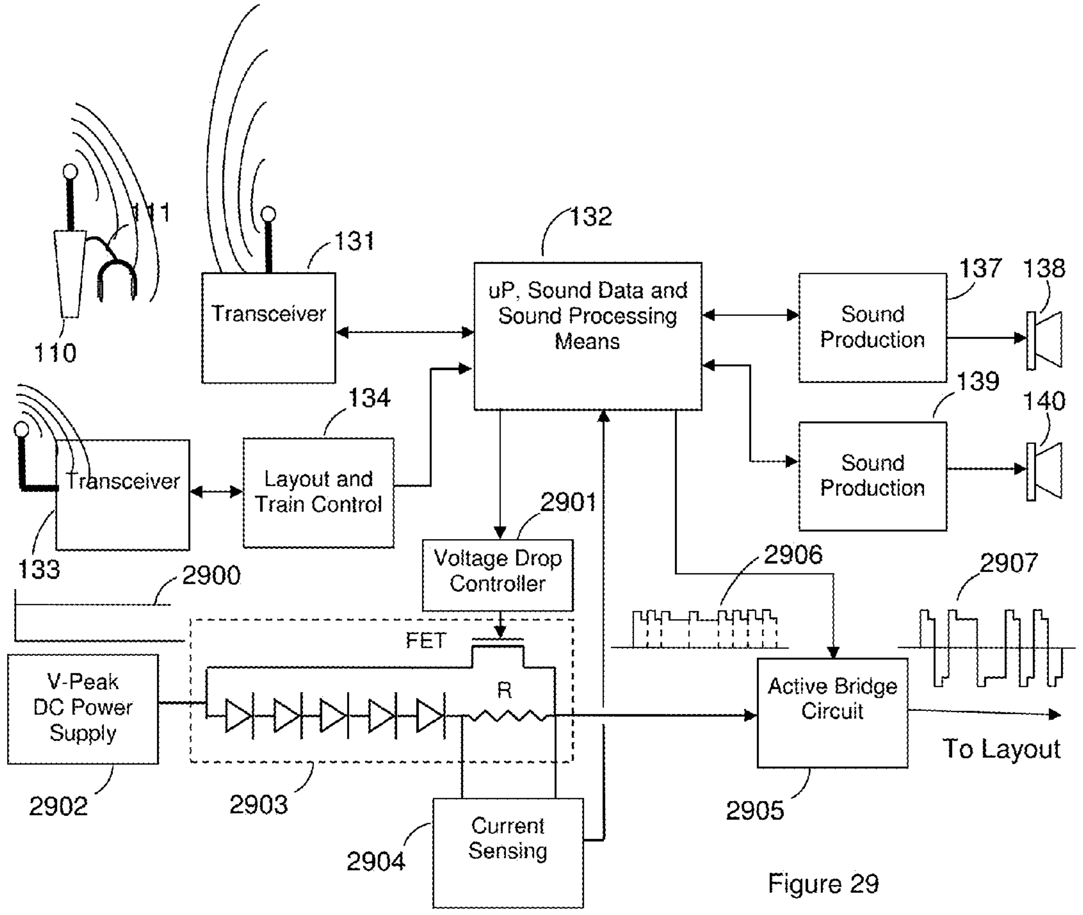

FIG. 29 shows a block diagram of the DCC control center to generate the notched DCC waveform in FIG. 28 and detection means to measure the analog current samples and embedded digital data.

Figure 30:
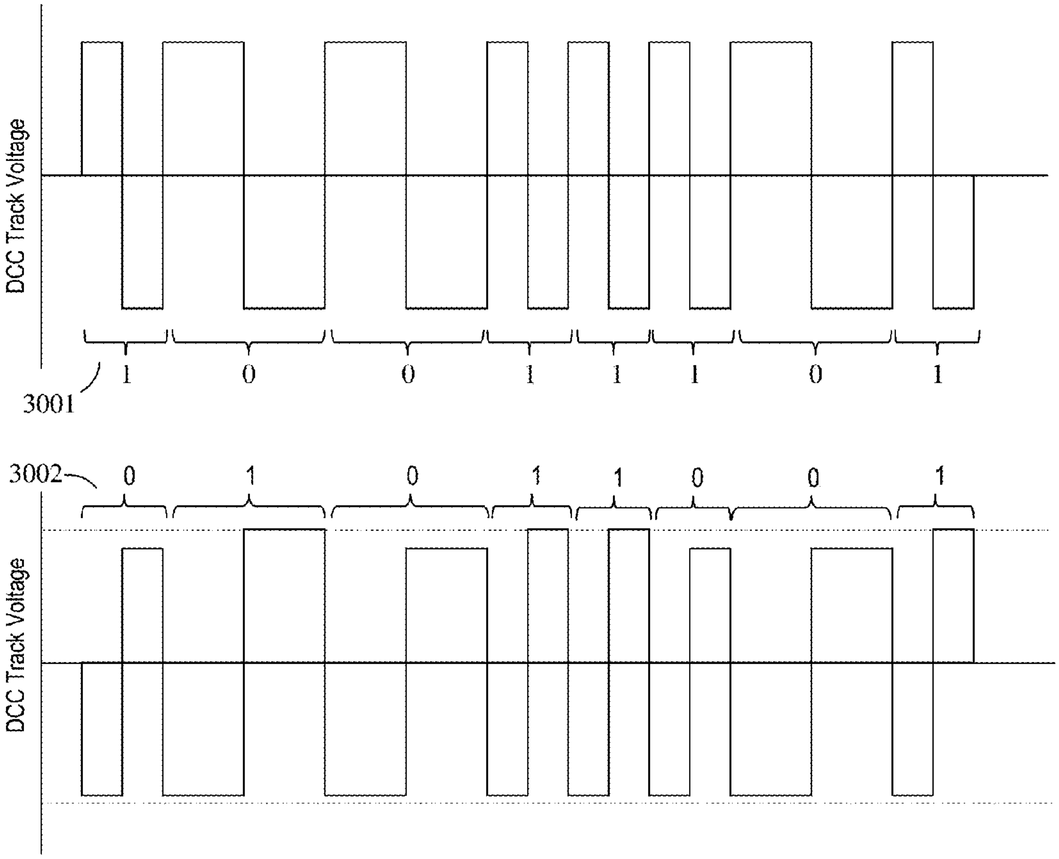

FIG. 30 shows a method for modifying the DCC waveform to generate local commands to DCC decoders within a power district.

Figure 31:
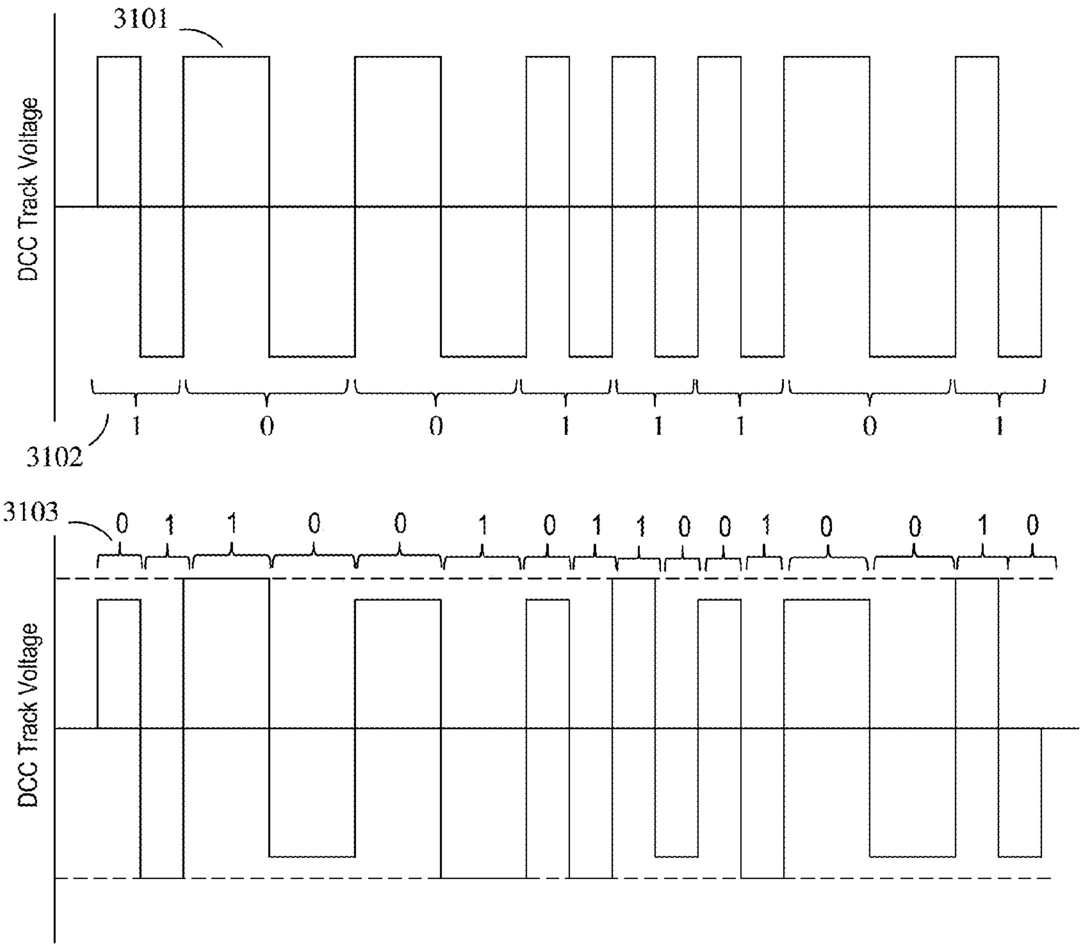

FIG. 31 shows how amplitude modulation on the DCC waveform at each half bit can double the local command data baud rate over the normal DCC baud rate.

Figure 32:
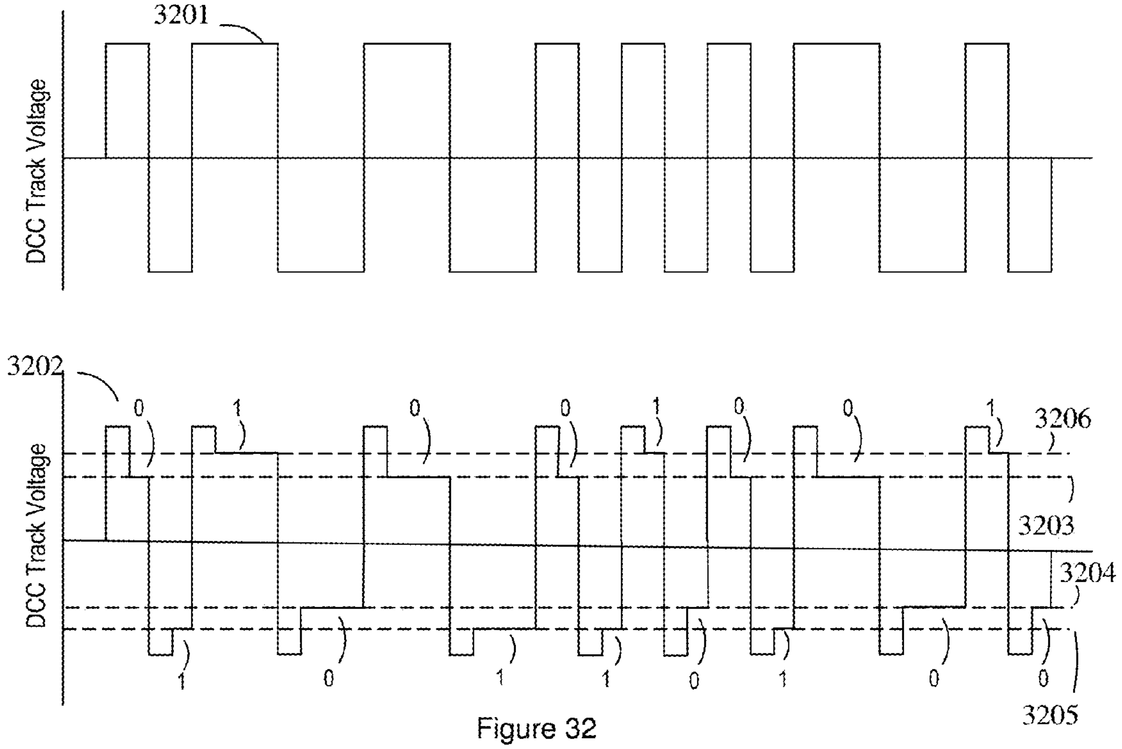

FIG. 32 shows another method of using The Drop at two voltage levels for both local commands and for bi-directional communication and BackWave audio.

Figure 33:
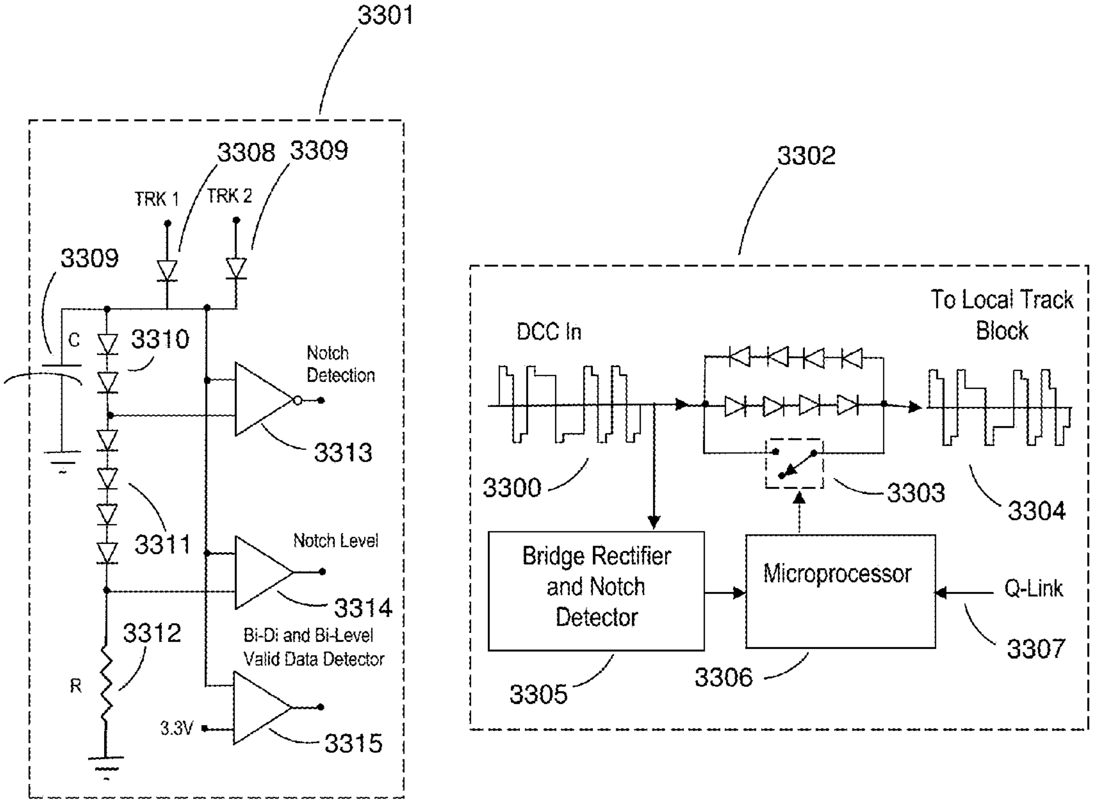

FIG. 33 shows a method to generate the two voltage level Drop and means to detect this information in the decoder.

Figure 34:
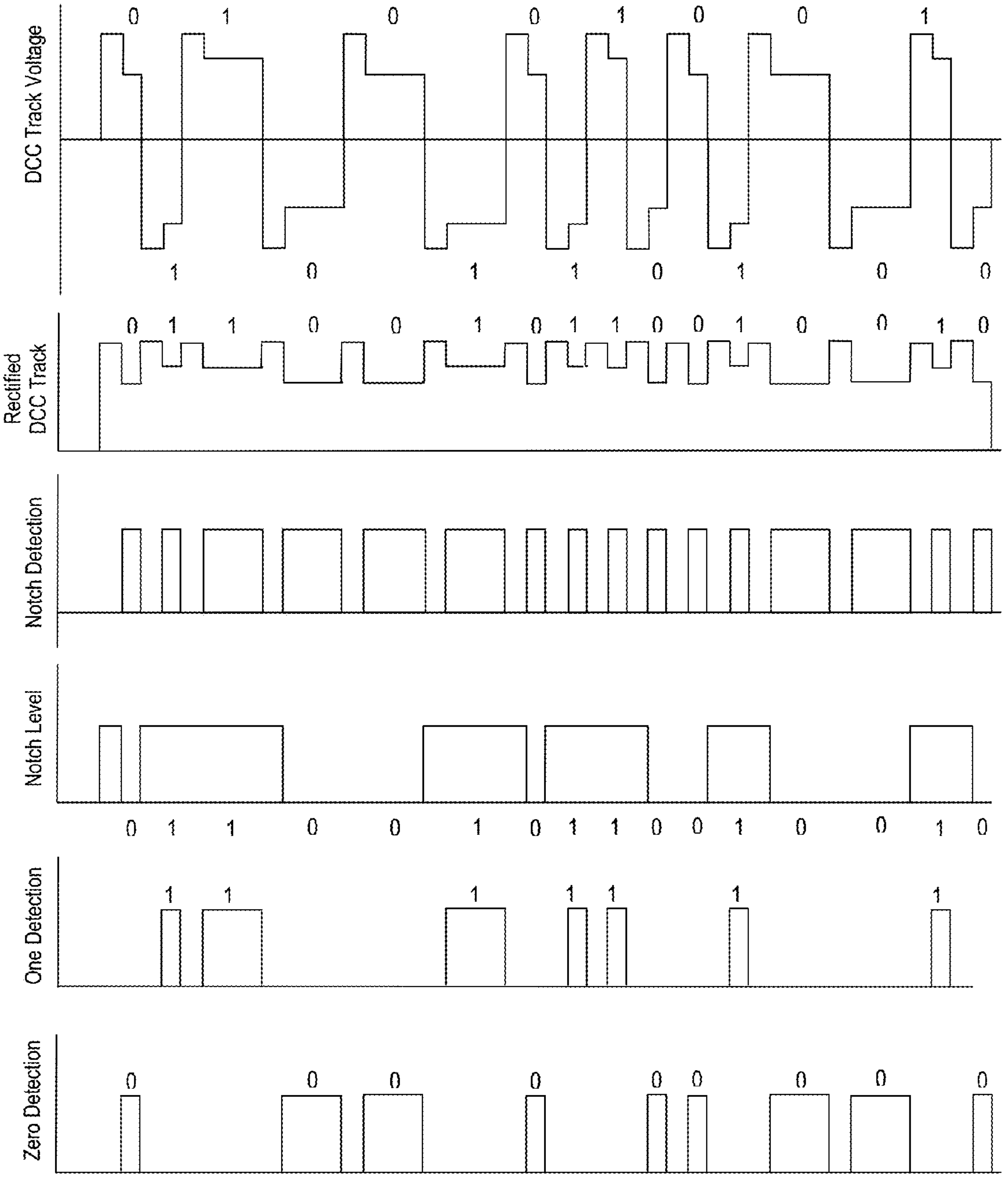

FIG. 34 shows notch, logic one, logic zero detection from the decoder shown in FIG. 33.

Figure 35:
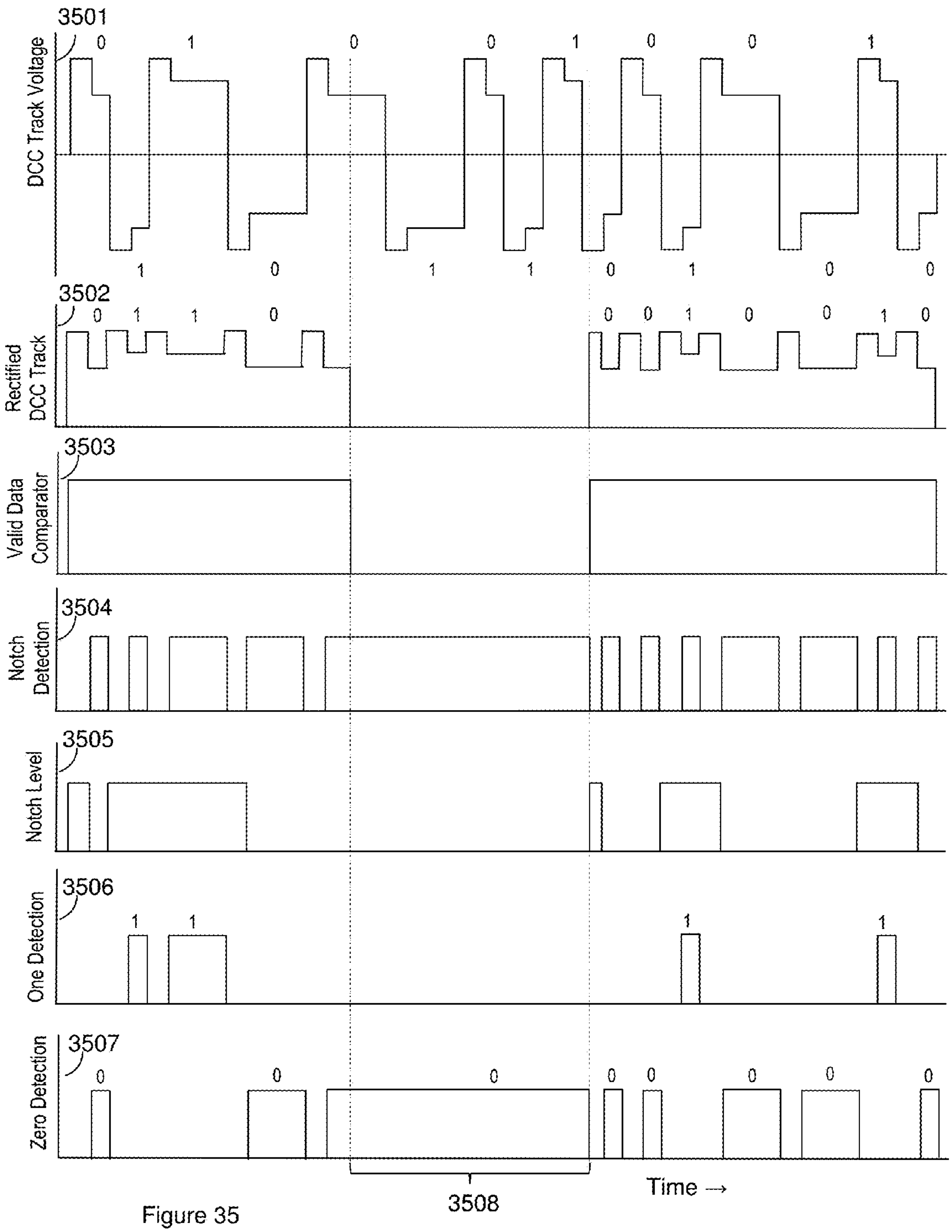

FIG. 35 shows the effect of the decoders loss of connection to the track and how it affects the digital polling data.

DETAILED DESCRIPTION OF PREFERRED EMBODIMENTS

Polling Bi-Directional Technology

Figure 1:
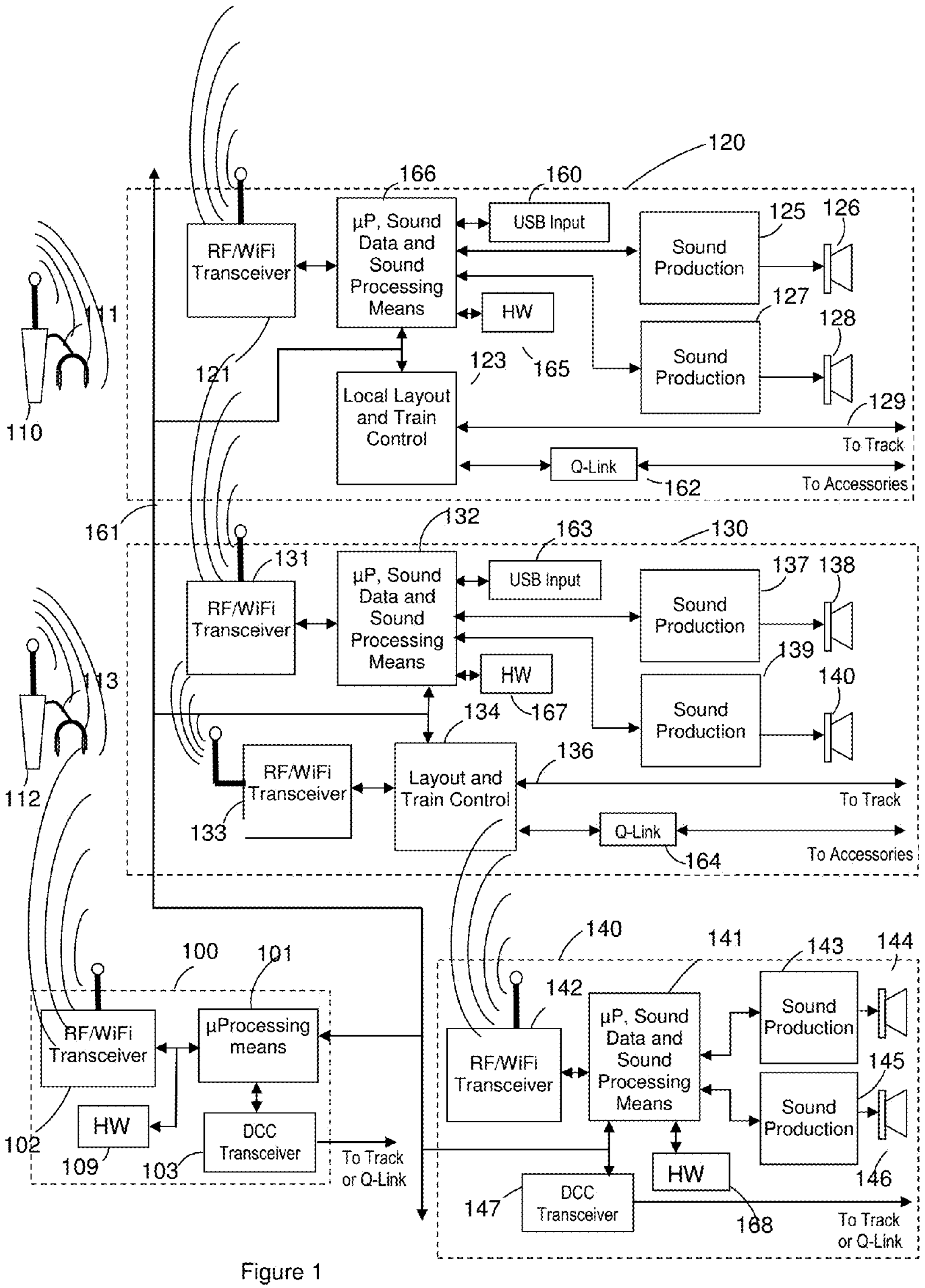
Figure 2:
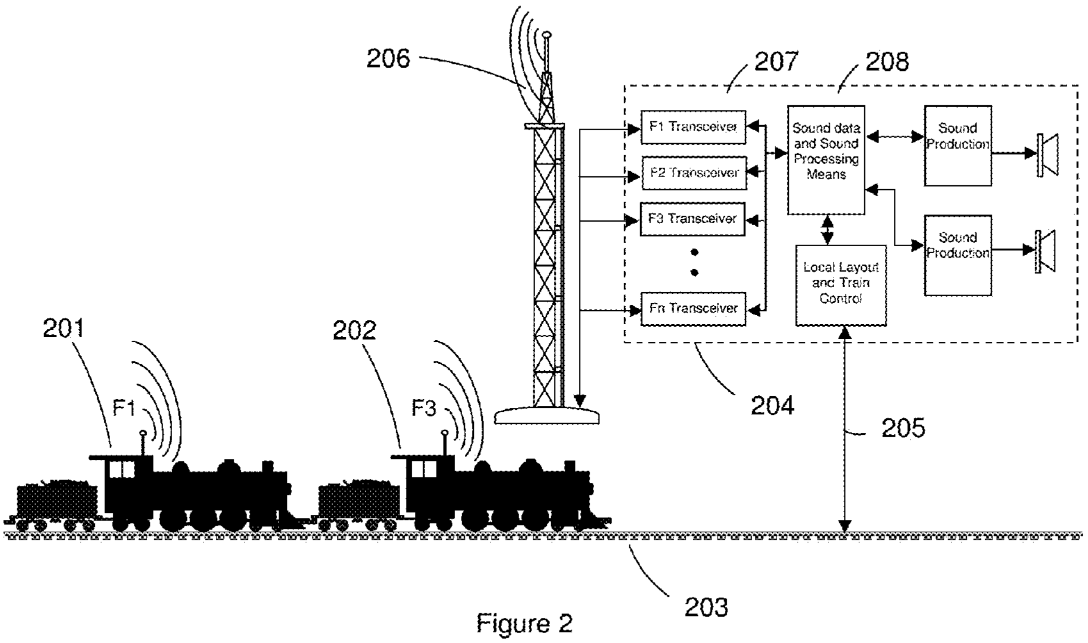
Figure 3:
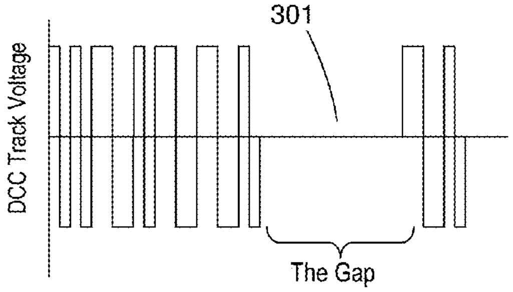
FIG. 3 shows an example of a DCC track signal employing the Gap in the Lenz technique for bi-directional communication.
Figure 4:
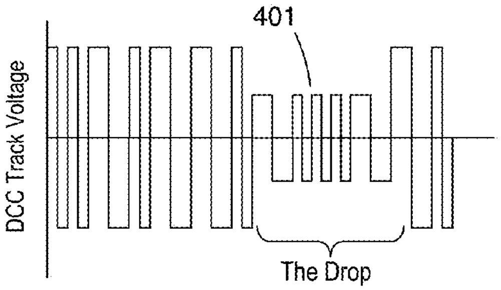
FIG. 4 shows an example of a DCC track signal using The Drop for bi-directional communication using a polling technique.

Our polling bi-directional system for data and sound can be applied to NMRA DCC, analog DC, analog AC, and is compatible with Lionel's TMCC system. There are similarities to the Lenz system but instead of using current pulses transmitted from the decoder, we use acknowledgement pulses in the decoder for both sound and data information, which is already an accepted method for bi-directional communication by the NMRA. Instead of producing a zero voltage Gap, we produce a low voltage "Drop" during which data is detected from the remote object. It is important to note that while the Lenz bi-directional system actually transmits a digital power signal from their decoder during the Gap that is received by the command station, our polling system does not require any power to be applied to the track from the decoder to provide digital data our sound information. In other words, the Lenz system actively transmits back information from the decoder, while the present polling methods retrieves information from a passive decoder. Another distinction is that DCC data continues to be transmitted during the Drop but no DCC data is transmitted during the Gap. The Lenz Gap is shown in FIG. 3 and an example employing The Drop, 401, is shown in FIG. 4.

Description of Circuit and Operation

Figure 5:
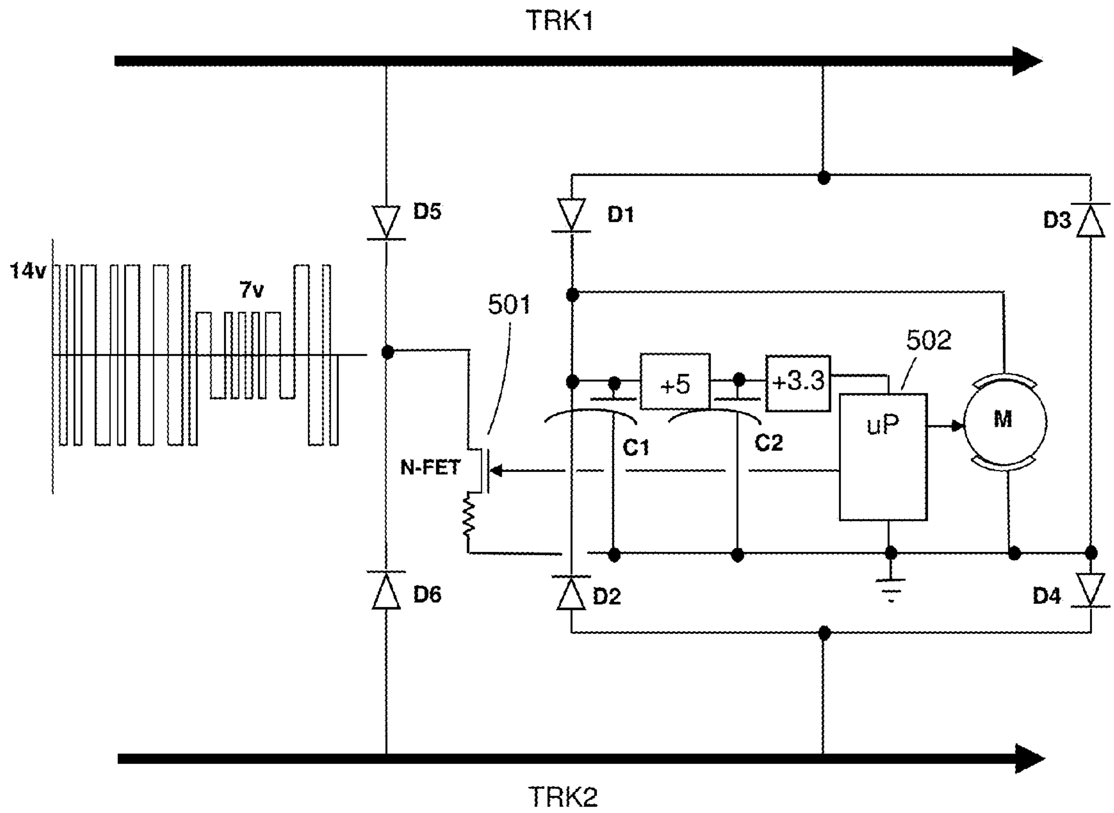
FIG. 5 shows a basic decoder with basic on-board power supply in addition to a calibrated current sink for bi-directional communication.

A simple basic decoder with power supply is shown in FIG. 5 to illustrate how The Drop along with calibrated current loading can be used to provide bi-directional digital data and analog sound values from the sound decoder in the model locomotive.

The circuit in FIG. 5 represents our typical on-board power supply consisting of bridge rectifier, D1, D2, D3 and D4, along with large filter capacitor, C1, five volt regulator, C2 filter capacitor and 3.3 volt regulator. The microprocessor, uP, and motor M load are also shown, although motor control detail is not included in order to simplify the drawing. Also not shown are track voltage detector ADC (Analog to Digital Converter) circuits for monitoring the voltage waveform of the track.

An addition current source circuit has been added consisting of a bridge rectifier, D5, D6, D3 and D4 and uP controlled N-FET. The full-wave rectifier bridge circuit for the N-FET circuit, and the full-wave rectifier bridge circuit for the on-board power supply, share the bottom bridge rectifier diodes, D3 and D4.

When the DCC signal is applied, current is supplied to the main on-board power supply and motor and also to the FET if it is on.

Figure 6:
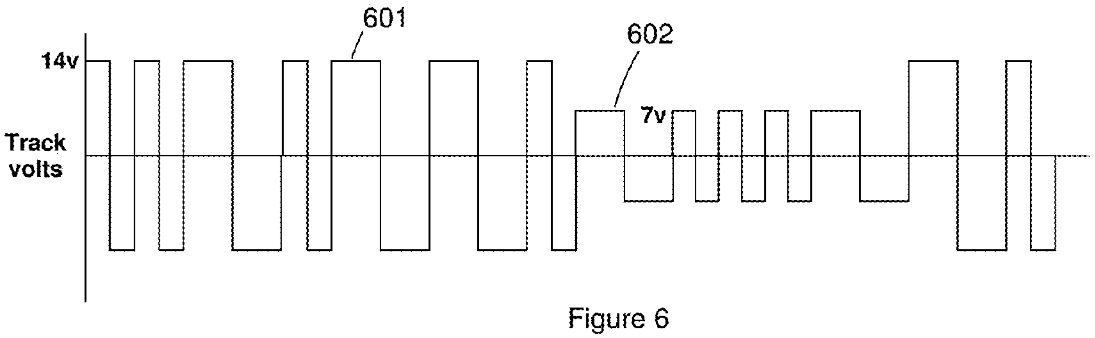
FIG. 6 shows a detailed example of the DCC waveform used between 14 volts peak, 601, and 7 volts, 602, during the Drop which maintains DCC data transmission at all times.

When the DCC peak voltage is reduced or dropped from a high voltage, 601, (say 14 volts) to a lower voltage, 602, (say 7 volts), as shown in FIG. 6, the main bridge rectifier is back biased, at least until the C1 capacitor discharges to 7 volts. During this time the only current flowing to this circuit is through D5, D6, D3 and D4 Bridge and N-FET current sink and perhaps a little current flowing in the track voltage detector ADC circuits.

Figure 7:
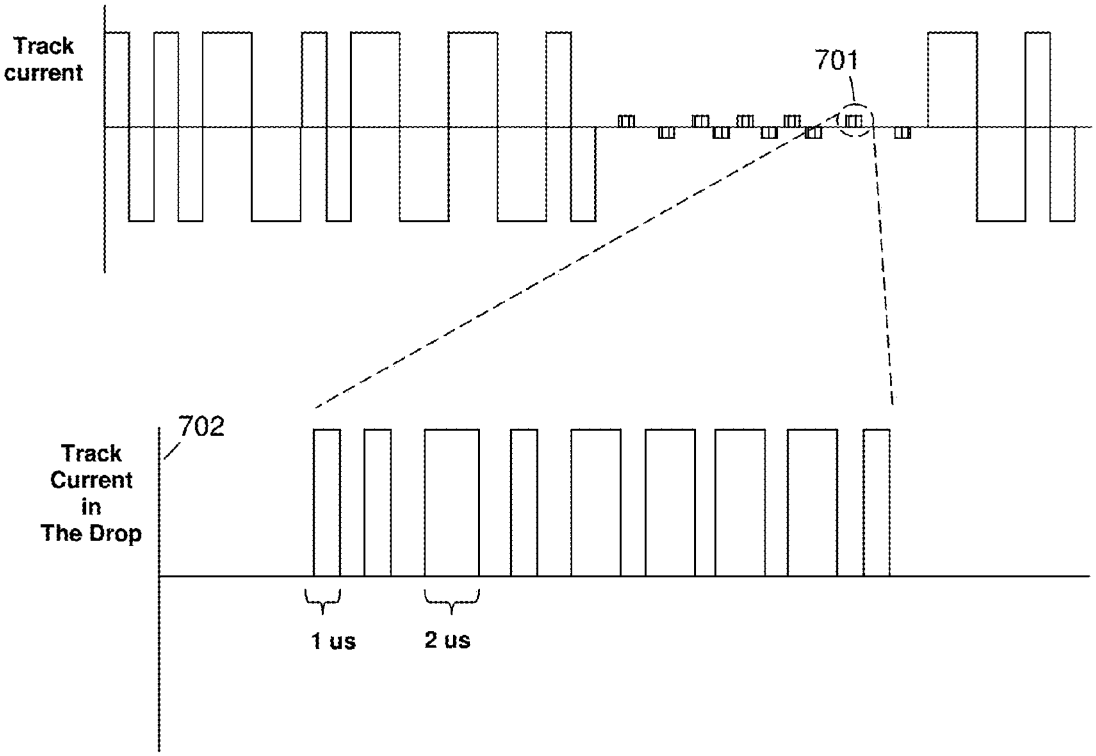
FIG. 7 shows an example of track bi-directional current polling data during The Drop and expanded detail of the nature of the digital current pulses.

It is during this voltage drop period, called "The Drop" that we can accomplish bidirectional polling communication. If the FET is turned on and off at say, 1 to 2 u-Sec intervals inside The Drop, the current in the track will register this change as 1 to 2 u-Sec current pulses as shown in FIG. 7 which can be detected at the DCC base station. The choice of current pulse period at the present time is arbitrary and used here only for explanation of the concept. FIG. 7 shows the high speed current polling data packets, 701, during The Drop as well as an expanded view, 702, of typical current data digital pulses.

A one microsecond pulse could be a digital 1 and a two microsecond pulse could be a digital zero but this is also arbitrary. For all zeros at 2 uS each, the total byte time is less than 30 uS including 1 u-Sec delays between bits. Since a DCC digital pulse is about 56-64 us, the bit widths could be expanded and still fit within a DCC digital one.

All bridge diodes should be Schottky diodes to avoid high power consumption and the enormous diffusion capacitance of P-N diodes. Also, if the motor discharged the C1 filter cap too quickly, we could shut the motor power off during The Drop.

Note "The Drop" could be one sided, which would reduce the polling communication rate by half but would help keep the main on-board power supply charged during one half of each DCC bit. In the case shown in FIG. 8, The Drop, 805, occurs after each bit. The voltage drop value is also arbitrary and only shown as 7 volts for instructional value.

This waveform would produce a distinct DC offset which would interfere with stretched zeros analog operation to control conventional locomotives in DCC analog mode. We call this an "Asymmetric Drop Waveform" since "The Drops" occur only during one polarity of the waveform.

Figure 8:
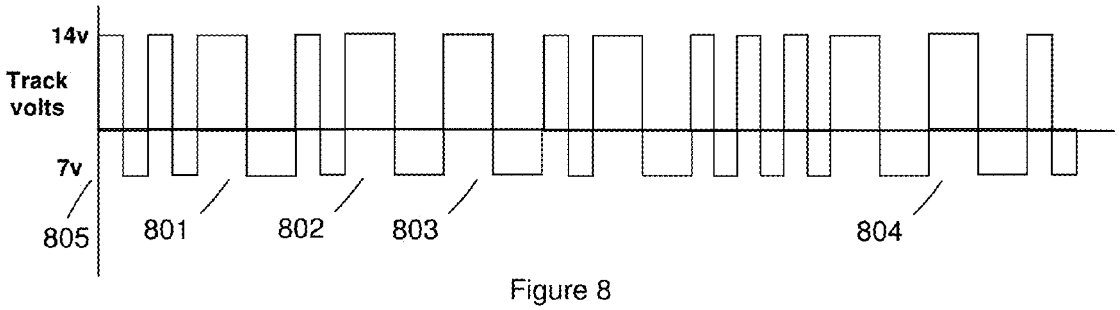
FIG. 8 shows an example of a DCC waveform where The Drop is one sided on the DCC waveform.
Figure 9:
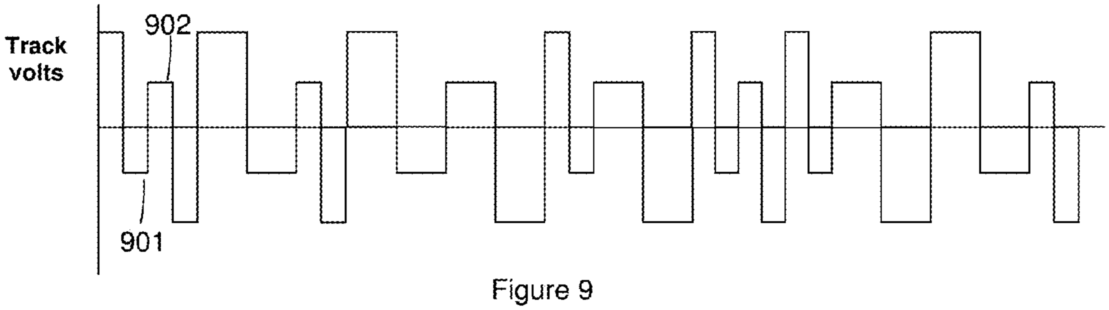
FIG. 9 shows an example of a DCC waveform where The Drop occurs after each DCC bit and before the next bit with reduced DC component.

As shown in the DCC waveform in FIG. 9, it is also possible to drop at the end of every bit, such as 901, and the beginning of the next bit, such as 902; In this case, there are two one-sided drops in a row where bidirectional communication occurs. Although this waveform still has a DC component, it is much reduced from the example in FIG. 8. We will call this a "Symmetric Drop Waveform" since "The Drops" alternate in polarity.

BackWave Sound™

Figure 10:
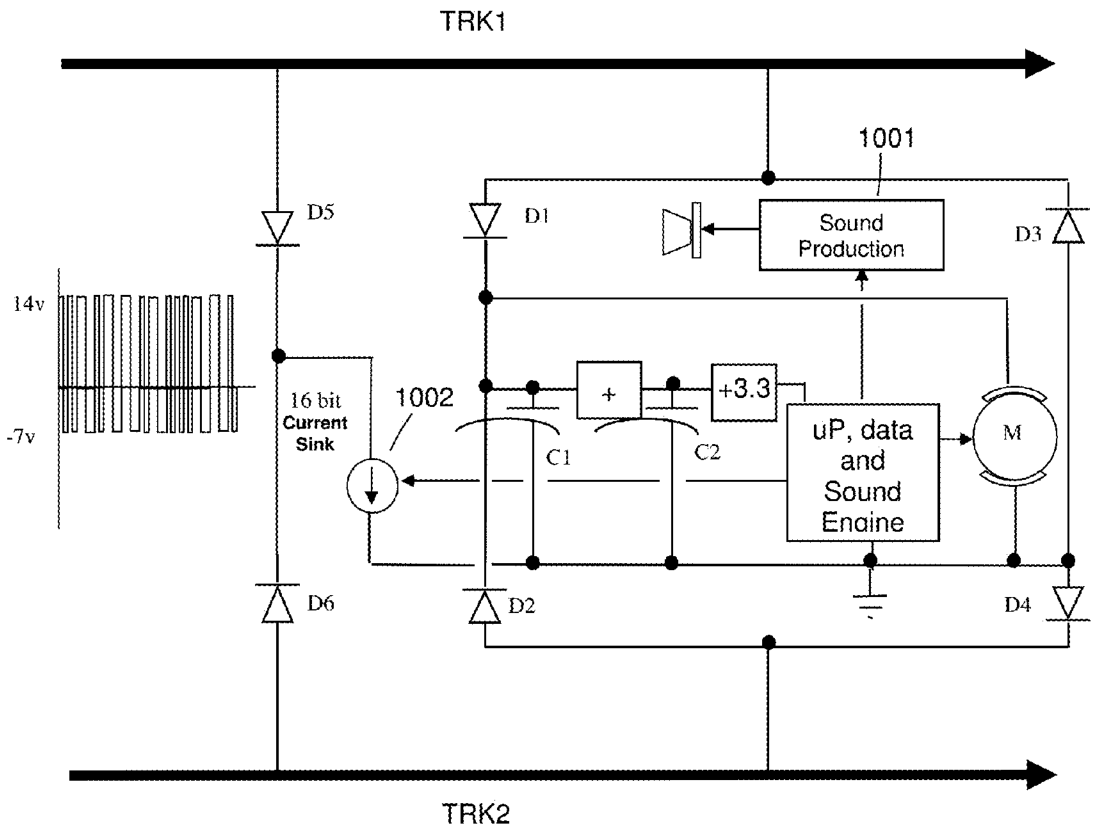
FIG. 10 shows an example of a sound decoder with basic on-board power supply in addition to a DAC current sink for bi-directional polling of digital data and bi-directional polling of sound analog sound.

The idea of BackWave sound is to poll an analog value that is the value of the present sound sample playing to allow it to be read by the command station that is producing the track waveform. The circuit shown in FIG. 10 is the same as FIG. 5 except that sound production, 1001, is added in addition to a calibrated current sink, 1002, that is an analog (DAC) function of the sound sample digital value and/or digital data. For instance, if we were producing 16 bit resolution on-board sound, the current sink analog value could be calibrated up to 16 bits. As each sound sample was fetched from memory by the microprocessor for sound reproduction, the same digital value is used to set the value of calibrated analog current sink. The current measured at the command station during The Drop would be equal to the value of the analog current sink at that time.

In this circuit, the current source can be set to a new sample value as each sound sample is fetched from memory. If the calibrated analog current source is updated continuously, the calibrated analog current source might look like the graph in FIG. 11 as an example of sound analog sample data.

In this example, current flows continuously from the DCC track voltage waveform through diodes D5 or D6 through the calibrated analog current source and then through D3 or D4 to return to the DCC track voltage supply. When the DCC track voltage waveform is at The Drop potential (7 volts in this example), all DCC track current is due to the calibrated current sink. At the full peak track potential (14 volts in this example), the current from the DCC track voltage supplies the entire on-board system through diodes D1-D4, including any current needed for the motor, recharging any power supply capacitors, as well as supplying the calibrated sink current through D4-D5 and D3-D4.

Figure 12:
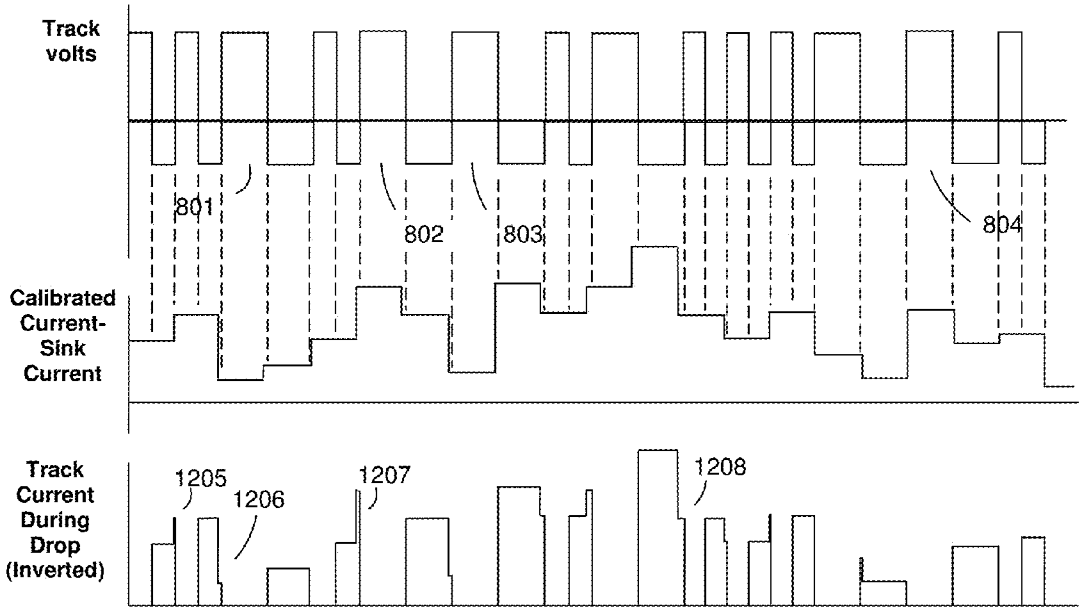
FIG. 12 is an example of asymmetric waveform drop on the track polling current.

For the Asymmetric Drop waveform from FIG. 8, the track voltage and current during The Drop would be determined as illustrated in FIG. 12.

Note that the track current is not uniform during each drop. The reason is that the calibrated current source may not be synchronized to the DCC waveform. Not only is the sample rate faster for the calibrated current source in this example but the DCC waveform has an asymmetric sample rate due to the unpredictable nature of data being transmitted down the track and the fact that digital ones and zeros have different pulse widths. The notch in the track current value, 1205, 1206, 1207,1208, etc. are due to timing misalignment with the DCC waveform.

Figure 13:
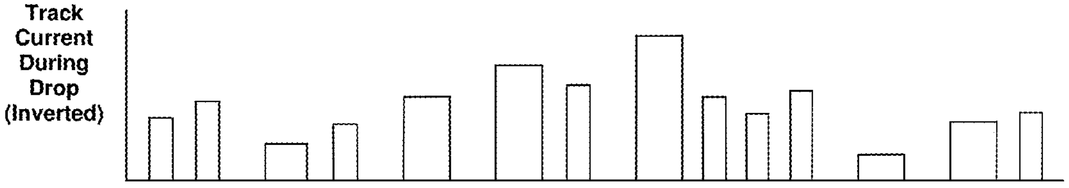
FIG. 13 is an example of polling current averaging at the DCC base station or track driver.

If the current pulses could be averaged mathematically in the DCC base station, the resulting current pulses would look like FIG. 13 for this same example.

Figure 14:
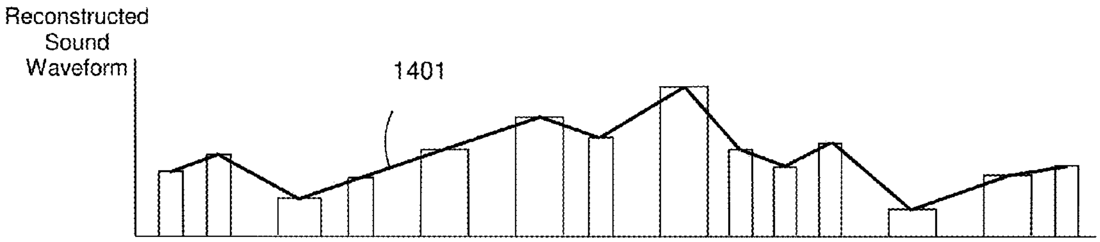
FIG. 14 is an example of a reconstructed waveform from the polling BackWave sound data.

And the reconstructed analog sound waveform would look similar to the dark line, 1401, in FIG. 14.

Figure 11:
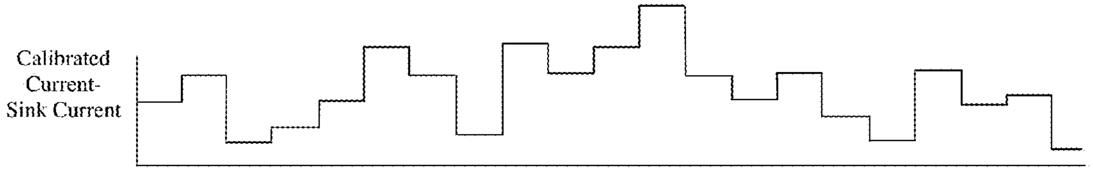
FIG. 11 shows an example of the analog sound data samples from the calibrated DAC current sink for each sound data sample used in BackWave sound concept.
Figure 15:
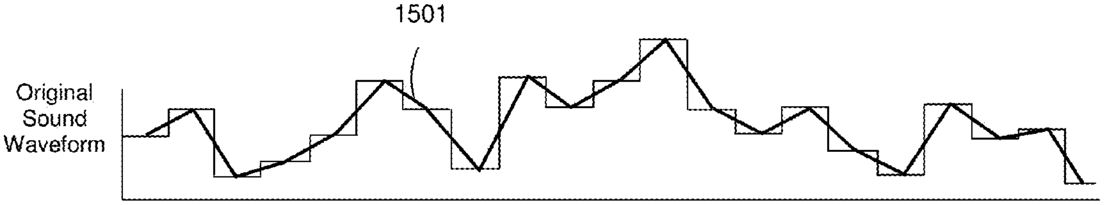
FIG. 15 is a best fit analog waveform from the original example of digital sound data samples.

Compare this to the original waveform in FIG. 15 from FIG. 11, where the dark line, 1501, represents a best fit reconstructed sound waveform.

Figure 16:
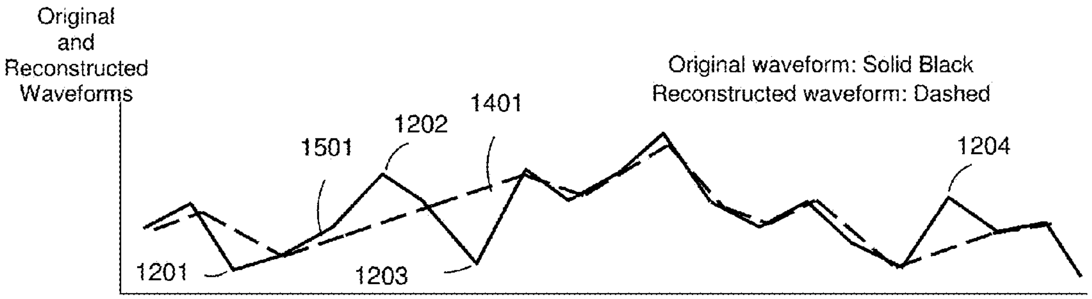
FIG. 16 is a comparison of original digital sound data samples and the reconstructed waveforms from polling BackWave sound data samples.

FIG. 16 compares the original analog reconstructed waveform, 1501, to the reconstructed analog waveform from the sampled sink current samples, 1401.

The reconstructed waveform is a good match over about one half of the indicated time period. However, there are four peak values of the original reconstructed waveform in FIGS. 16 (1601, 1602, 1603 and 1604) where the match is quite poor between the original and the reconstructed waveform. The reason is quite apparent from the sampling times from the original DCC waveform from FIG. 8, which is also shown in FIG. 12. The four areas shown as 801, 802, 803, and 804 are where virtually no pole current samples were made of the original waveform occurred because the DCC waveform was not in The Drop sampling period at those times. These four areas represent critical data changes that were not sampled and include in the reconstructed waveform. For instance, 801, represents a sample time which occurred a low value in the original sample waveform 1601. The high current value, 1602, was not sampled at 802. The precipitous drop, 1603, was not sampled at 803 and the rapid rise at 1604 was likewise not sampled at 804.

This is not surprising; it is a consequence of sampling at a lower rate than the original sample rate; data will be lost. Since our intent is to provide the best reconstruction of the original data at the new sink current sampling rate, it would be good to analyze the accuracy of the reconstructed waveform for the bandwidth corresponding to the DCC sample rate. In other words, it we assume an average sample rate based on likely occurrence of DCC ones and zeros, there will be a corresponding Nyquist frequency that provides a good estimate of the best bandwidth we can expect at our DCC sample rate. As an example, if we assume equal occurrence of DCC ones and zeros, the average sample rate is 2 samples per 300 u-Seconds or an average sample rate of 6.67 k-Samples/sec. Nyquist would be 3.33 kHz. Since DCC ones are much more common than zeros, this is a good worst case estimate for expected bandwidth for the type of "Asymmetric Drop Waveform" used in this example.

Figure 17:
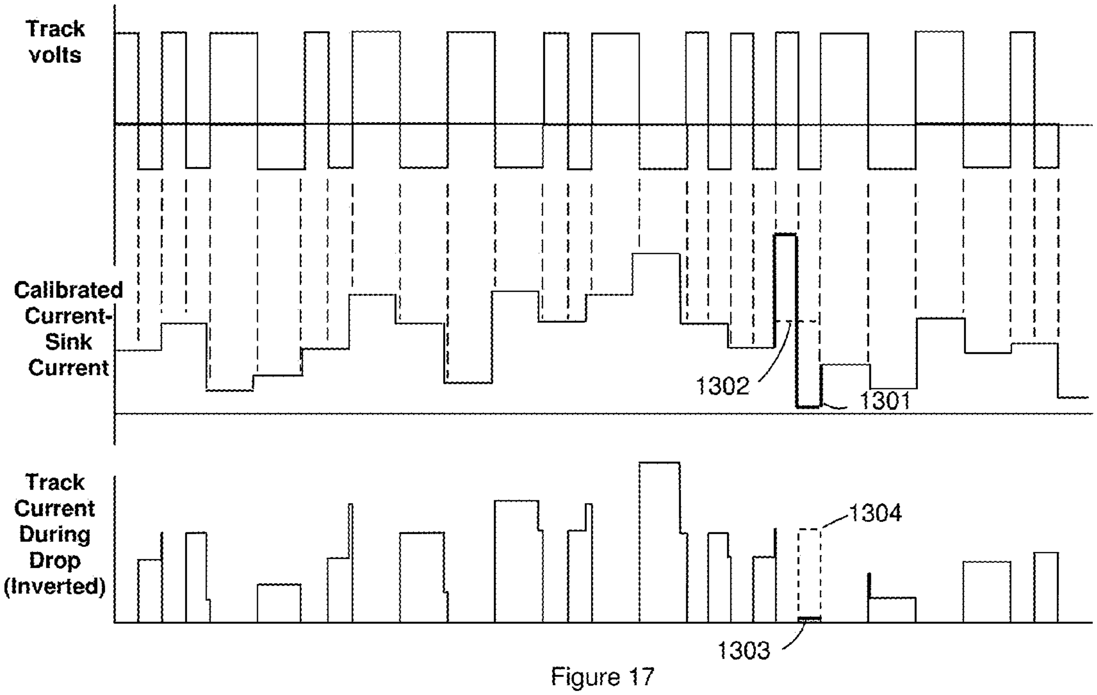
FIG. 17 shows an example of the effect of a high frequency component in the original data on the polled sample data.

In any case, the data rate presented to the Calibrated Current Sink will need to be bandwidth limited to a sample rate that is approximately the DCC sample rate. This will ensure that high frequency components that are present in the sound records do not contribute to the lower frequency samples from the DCC sample rate. For instance, if the current source received a single high value high frequency contribution that was present during one of the DCC sample periods, it would contribute a false low frequency value at the lower DCC sample rate. As an example, consider the waveforms from FIG. 12, where we have added a high frequency contribution to the Calibrated Current Sink, 1301, shown in bold in FIG. 17. The original value from FIG. 8 for this period is shown as dotted line 1302. Since our addition to the Sink Current Waveform is symmetric, the dotted line, 1301, represents the average value during this period.

This high frequency component is above Nyquist for the DCC average sampling rate but yet it contributes to a significant error in the sampled waveform as shown by the new value, 1303, compared to the original value 1304.

Because the sampled sound record data used to set the Calibrated Sink Current has terms in excess of Nyquist, this data should be resampled at a lower frequency nearer the DCC sample rate. However, the DCC sample rate is asymmetric in time and unpredictable except for its average value. What is required is a way to adapt the resampling of the sound record data to correspond to the changes in the DCC waveform sample times. In addition, we would like the sink current samples to line up to the DCC sample periods to ensure a single value for each sample. This will ensure that the reconstructed waveform at the command station will be an exact copy of the resampled sound record data.

One way to resample data is to do waveform analysis on the original sampled data to provide a best fit analog curve to provide continuous values over time. This curve can then be resample to provide a new digital record at a lower sample rate. Another simple option is to average adjacent values to lower the sample rate by a factor of 1/(number of averages taken).

Figure 18:
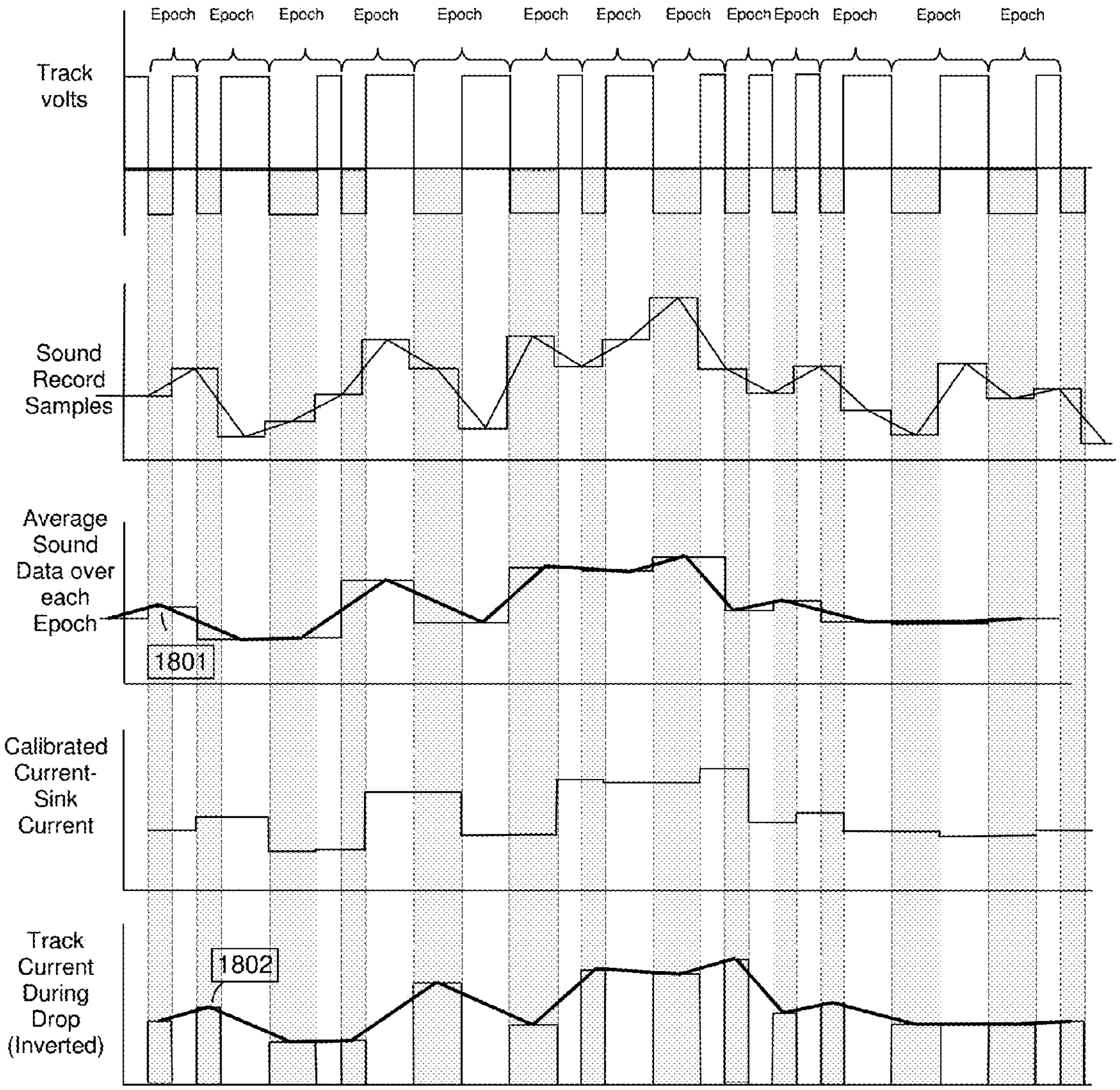
FIG. 18 shows the results on track polling current with averaging the original sound data over epochs of polling and its adjacent non-polled periods.

One option is to time average each previous epoch from the last DCC sample read up to the start of the DCC current sample read. The data presented to the DAC current sink would be this average of the previous data. For instance, consider the thirteen Epochs shown in FIG. 18 for the example Asymmetric DCC waveform from FIG. 12.

Each Epoch starts and stops when the polarity changes to the Drop voltage of 7 volts. It is the time average during this period that is applied to the Calibrated Current Sink for the DCC sample read.

FIG. 19 shows two curves. The dashed curve, 1901, shows the results of averaging adjacent sound samples on the original Sound Record Samples from the second graph in FIG. 18. This curve represents a simple resampling of the sound data at one half the original sample rate where new samples are calculated from simple averaging of adjacent original sample points. In the absence of using adaptive averaging, this might be the preferred method of providing low pass filtering and resampling to a lower sample rate to avoid inaccuracies during the DCC sampling as discussed above.

The solid curve, 1801, shows the reconstructed waveform from DCC samples based on Adaptive Averaging of the original sound samples. The dashed curve has been moved to the right an average of 150 uSec since each sample represents data from the previous epoch and on the average is late by an amount that is based on delay contributions from DCC ones and zeros (where we have assumed equal occurrences of both ones and zeros).

FIG. 20 shows two curves. The dashed curve, 1901, is the same as that shown in FIG. 19 and represents a simple resampling to one half the original sample rate based on simple averaging of adjacent sample periods. The solid curve, 1401, is from FIG. 14 and is the reconstructed waveform from raw DCC sampling of the original sound records.

Comparing FIG. 19 and FIG. 20, the reconstructed waveform from Adaptive Averaging appears to be more accurate (using root-mean-square error analysis) when using asymmetric time sampling from the example DCC waveform used in these examples.

Lost DCC Signal

Model trains do not have perfect electrical pickup. Sometimes the pickups are resistive and sometimes all connection is briefly lost. Our bidirectional method of detecting a current load is very forgiving of resistive pickups since the detected current will still have the same value even if there is some insertion loss due to voltage loss across the pickups, that is, as long the voltage Drop does not exceed the voltage compliance of the current sink.

Complete pickup loss is a different story. At reasonable speeds the loss is usually very brief (1-100 uSec). At low and very low speeds, the loss can be a few milliseconds to full loss at speeds below 1 smph. Most sound systems w/o UPS backup will have enough stored charge for only about 10 mSec. If we assume a reasonable loss of 1-2 msec in DCC track signals from time to time, this represents a loss of about 10 samples. If this behavior were common at low speeds the Nyquist bandwidth would be reduced to about 300 Hertz which is not great but probably acceptable.

The command station can make some compromise of these kinds of losses by detecting that no bidirectional samples are being received and playing recently detected sound records. One method is to play the last few milliseconds of detected and stored sounds backwards and then jumping to any new sound samples that are then detected. To ensure that the command station knows when no signal has been detected, a minimum sink current should always be present even if the sound is at its minimum value. That way, if the command station does not detect any bidirectional current at all, it would know that it is due to a loss of DCC signal at the on-board sound system and not a minimum sound value.

One advantage of Adaptive Averaging is that if the DCC signal does disappear, the averaging continues. When the DCC signal returns, a reasonable data point is then sampled.

Method for Doing Adaptive Averaging for Asymmetric Sampling:

The diagram in FIG. 21 shows the method for doing Adaptive Averaging which would be an addition to the decoder circuitry shown in FIG. 10. The DCC signal, 2100, is applied to the DC Edge detector, 2101, which determines that a DCC polarity transitions has occurred or that a disconnected DCC signal has returned. The DCC signal, 2100, is also applied to the DCC Level Detector, 2102, that determines if the DCC signal is in The Drop. If these two conditions are met in the DCC Sample Detector, 2103, then the Timer, 2104, is reset and started.

The Timer then triggers the Digital Sound Sample Integrator, 2107, to send its present average value to the Time Average Register, 2108, which sets the value of the Digital to Analog Convertor Current Sink, 2109, to produce a calibrated current. The Digital Sound Sample Integrator, 2107, then immediately starts time averaging the current value of the Digital Sound Sample Register, 2106, which contains the current value of the sound sample. As each new sound sample is produced by the Digital Sound System Digital Output, 2105, a new sound sample value is presented to the Digital Sample Register, 2106, to be time averaged by the Digital Sound Sample Integrator, 2107. The Digital Sound Sample Integrator integrates over time the series of Digital Samples sent to it by the Digital Sample Register by summing the current value at each time interval. When a new DCC Sample Resets the Timer, 2104, the total time is read by Digital Sound Sample Integrator, 2107, which is divided into the current integrated sum value. This new value is then sent to the DAC Calibrated Current Sink and starts integrating the new values from the Digital Sound Sample Register. This process continues over and over as each new DCC Sample Detection is received.

The block diagrams in FIG. 21 are illustrative of the functions necessary to perform the detection, timing, averaging, etc. Depending on the microprocessor and its I/O capabilities, the functions shown could be produced in software.

Analog Sound Summing and Digital Data Communication

An advantage of using current polling of analog sound samples is that the current samples from all locomotives on the track are summed by the command center detector. A big advantage of using Adaptive Averaging is that the DCC Sample current is constant and does not need to be post processed at the command center to determine an average value necessary to reconstruct the waveform. This is also important if it is necessary for the command station to wait until the measurements settle before the value is accepted. Without Adaptive Averaging, the current is not ensured to be constant from any powered locomotive and there is no way to tell when the polled current is a valid indicator of the actual summed sound samples.

Another advantage of constant current is that it may be possible to combine bidirectional digital communication and analog sound sample polling. This method consists of using the calibrated DAC sink current source to produce the sum of the analog sound sample current and a fixed additional digital current value. For instance, the graph in FIG. 22 shows the current generated by the DAC when a digital word is superimposed on the analog sound sample during a 112 uSec DCC sample epoch. The fast digital signal, 2201, is shown expanded in the bubble, 2202.

Some advantages of this circuit are:

- The locomotive does not need to supply current from its own limited power supply and filter cap for bi-directional communication.
- This method is compatible with DCC and can also be used in Analog without modification and would not eliminate some of the decoders that are currently incompatible with Lenz's method.
- This method could also be compatible with Lenz bi-directional communication as long as The Gap and The Drop did not occur at the same time.
- The current can be larger and more detectable.
- For BackWave sound, the current representing the analog sound value can be summed for each locomotive on the track.
- This does not appear to infringe the Lenz patent or other patents listed in his patent.
- This is a safer design than Lenz's method since it is not necessary to short out one of the lower bridge diodes during bi-directional communication.

This technique is relatively immune to resistive track pickups on the locos since the sink current remains the same even if there are a few volts of drop across the pickups. This is particularly important for BackWave sound.

One advantage of the Asymmetric waveform is that on the average there is no DC component. However, over shot periods there can be a small DC offset depending on the bit pattern.

Additional Observations:

We could have the step waveform decay to keep up with the decay of the on-board filter capacitor. Also the slant in the waveform would prevent infringing Lenz patent that claims data being transmitted only when the DCC waveform is not changing.

Instead of the two disconnect diodes for the calibrated current sink, we could instead have a pass device that would shut off the main bridge so no current flows into the motor or electronics. Transmitting bi-directional acks (acknowledgement pulses) via the calibrated current sink could be done without a step in the waveform. This keeps DCC as it is but unfortunately it means that most existing decoders will not work with the BWA system. The voltage steps will allow most decoders to still be operable with BWA.

Bi-directional communication can be used to talk down the cars in a train. It can selectively talk to only those locomotives and cars that have electronics. The idea is that the bi-di gets detected at the base station, which then retransmits the data via changing the steps in the waveform from one voltage to another or by increasing or decreasing the peak DCC voltage bit by bit. Each car or loco on the track will be witness to the changed waveform and hence get the data as it is generated.

Instead of a separate upper bridge to power the current sink, we could simply shut off the power to the motor and on-board electronics with a pass device right after the main bridge. The only load connected would be the current sink. This would have the effect of discharging the parasitic inductance quickly since there would be large voltage drop across the pass device during the discharge. The only reason not to use this method is that other non-QSI and early QSI products would continue to provide a load to the power supply when we are trying to read bi-directional acks.

The loco can know when it has failed to deliver bi-directional digital acks, since it knows when it has lost power. When this happens the loco can send out a new byte right away without having to wait for the base station to analyze the data and report back via DCC.

Another waveform that is symmetric and can have twice the bi-directional data transmission rate is shown below.

Imagine a pure DCC waveform (without notch) being applied to our Track Driver or booster, which generates the modified track waveform and reads bi-directional current sink data and/or BackWave audio samples from locomotive decoders. Our booster has no way of knowing whether it is a one or a zero. In order to create the above waveform the booster needs to buffer the digital data and then recreate the waveform which would be time delayed from the original as shown in FIG. 24. It would need to be delayed by the period of one digital zero (100 uSec). The original waveform and its reconstruction by the QSI Booster are shown in FIG. 25.

Another problem besides the complication of recreating the waveform is that the customer would have to give up using his other boosters; otherwise there could be a short between power districts as the conducting wheels moved over the adjacent track joints between blocks. In fact, the NMRA has a specification that the delay in a booster must not exceed 5 uS.

There are also problems if stretched zeros or Lenz bidirectional are used. A stretched zero means the delay must wait until the zero is finished before recreating it with the notch which can be a delay of 1 mSec. If we agreed to accept stretched zeros, then the minimum delay in our booster would be 1 msec. If "The Gap" is used with Lenz bidirectional, then there is about a 300 uSec period without any DCC transmission while the bi-directional data is read. During this period the Lenz DCC transmitter would be primed ready to accept bidirectional information from Lenz decoders, but the QSI Booster would be sending delayed DCC waveforms during The Gap, preventing any reception.

These problems could be eliminated if the notch were on the leading edge of the reconstructed waveform as shown in the diagram in FIG. 25. However, this presents another problem with settling time. When the notch starts, the voltage will oscillate or ring for some time due to track inductance. The amount of time it takes to settle depends on the amount of inductance and the voltage change to the start of the notch. If the notch is at the end of the waveform, the voltage changes by ΔV but if the notch is at the beginning, the voltage changes is twice the DCC peak value less ΔV, or 2VA−ΔV. This is a much bigger value and requires a much longer settling time, making it unlikely to read the data. Lenz has a settling spec of 32 uS for "The Gap" which is generated by a voltage change of VA, the peak DCC voltage. If our ΔV is about 2 volts, and the peak voltage about 16 volts, then the corresponding settling time for a notch at the end of DCC waveform is about [2/16] *[32 uS] or about 4.0 uS. If the notch is at the beginning, the settling time is [(2*16−2)/16]*[32 uS] or about 60 uS, which exceeds our 25 uS window.

One way to solve the problem of delaying the waveform until after it is determined if each bit is a one or zero, is to start the notch 25 uS after the waveform has started regardless of its period, and then let the notch extend all the way to the end. This creates a longer notch for zeros than for ones which should not cause any problems and in fact may have some advantages.

Starting the notch 25 uS after each DCC bit starts allows the QSI Booster to meet the NMRA DCC delay spec of 5 uS. This type of waveform is shown in the diagram in FIG. 26. The top wave is the DCC waveform applied to the booster and the second waveform is the output of the QSI Booster.

The extended notch has the additional advantage of improved sample rate for BackWave sound. The sample 25 uS windows are shown in the second diagram in FIG. 27. The longer notch for the DCC zero bit allows us to have two 25 uS sample intervals. For illustrative purposes, if we assume the DCC digital "one" pulse is 50 uS rather than 56 uS, we can assume the time interval between sample windows is also 25 uS. This allows us to calculate the approximate sample rate of once every 50 uS or 20,000 kSamples per second. This is actually higher than our intended sample rate for our sound engine (approximately 16 kSamples) which means we could actually send full bandwidth sound via BackWave technology to our TrackDriver or district power module. A sine wave at Nyquist (8 kHz) is shown in the third figure and the sampled value (with full sample window) shown in the last figure. I think it would have been a useful addition to our recent ASIC (Application Specific Integrated Circuit) chip to include a sample-and-hold ADC output for our BackWave sound rather than to have to filter and resample the result at the TrackDriver.

Another advantage of the long sampling period possible with the extended zero Drop is that digital data can be transmitted, possibly up to a full byte. Normally, we had intended to include a nibble for each digital "one" notch. This would allow a full byte per DCC digital bit. This is shown in FIG. 28 where a nibble is shown for the top notch; the second nibble would be transmitted on the bottom notch for the same DCC "one".

The expanded bubble, 2801, below the track voltage waveform shows the track current during the period of our bi-directional communication period. The current is shown descending rapidly with the beginning of the notch because the power supply filter cap back biases the Quantum System bridge rectifier. There is a period of time, $At_D$, where the track current oscillates due to the track inductance. After the oscillations die out, the current remaining is the slow audio analog current from the on-board calibrated DAC current sink. The digital current data is superimposed in parallel with its own current sink. The digital data is a series of 4 uS wide current pulses with 4 uS separations. A digital "one" is when the current sink data is present and a digital "zero" occurs when the digital sink current is zero. A similar waveform occurs on the negative notch where the second nibble occurs. The two nibbles make up a single digital word.

This technique allows us to produce specific bi-directional data in concert with the digital packet sent to an addressed locomotive. We are looking for the following kinds of information from a locomotive each time it is addressed: 1) speed (8 bits), 2) simulated brake pressure (8 bits), 3) simulated fuel (8 bits), 4) simulated water level (8 bits), 5) track voltage (8 bits), 6) real motor current (8 bits), 7) real temperature, 8) simulated diesel traction motor current, 9) trip odometer value (8 bits?), 10) cutoff value for steam locos, 11) light settings (16 bits), etc. Not all of this information is necessary during each transmission, but there is nevertheless, a great deal of information we need from each locomotive updated regularly for display on our gauge pack and for control of the individual trains.

One critical piece of information that we do need is the location of each locomotive. One way to do this is to know when a locomotive enters a power district and then to track its location by the value of the trip odometer and the positions of the turnouts. The above bi-directional communication system allows each track driver to know rapidly when a locomotive enters its district since only its bi-directional receiver gets that information when it sends its speed command. It can then send an immediate command to that locomotive to start its trip odometer to track its position.

Since bi-directional information starts only after the locomotive knows that a packet is sent to its address, we will start transmitting after the first two DCC bytes are generated for extended packet formats. This leaves from three to four bytes plus the two to three zero separators (start bits) remaining in the packet for bi-directional transmission in addition to the following idle packet of 20 DCC ones. This is a total of 44 to 52 DCC bits per extended packet or 44 to 52 bytes of bi-directional information.

If we add the extra transmission opportunities for the extended notch on zeros, we can transmit even more information. We know we will have a fixed 5-6 start zero bits for each DCC byte, plus on the average about 20 to 28 zero bits as part of the 5-6 byte commands. This provides a total of 64-80 bytes of bi-directional communication per packet. The baud rate for this would be about 64 kbits/sec assuming a average of 8 k DCC bits per second. In contrast, the Lenz system sends back five bi-directional current pulse communication bytes when the track power is reduced to zero for 300 uS after a under a command to the specified locomotive to send this information back. Since this happens only after a full placket is sent, or a average of 64 bits or once every 6.9 ms, the Lenz data rate is really only about 5.8 kbits/sec.

DCC Notch Transmitter

A block diagram of the DCC control center to generate the notched DCC waveform in FIG. 28 and detection means to measure the analog current samples and embedded digital data is in FIG. 29.

The notch is inserted into the DCC waveform via the Voltage Drop Module, 2903, which consists of a series of dropping diodes, a resistor for current sensing, and a FET under microprocessor control to either produce a fixed insertion loss or short circuit when the FET is activated. The Voltage Drop Module, 2903 is shown as a specific embodiment for clarity. In general, there can be other ways of producing the voltage drop needed by this module. A DCC waveform is commonly created from a fixed DC voltage source, 2902, and an active bridge circuit, 2905, under microprocessor control to alternate the polarity applied to the track to produce specific DCC commands. In FIG. 29, the voltage Drop Module is in series with the DC power supply, 2902, and the Active Bridge Circuit to produce a voltage drop under command from the microprocessor. The DC power supply waveform, 2900, shows a constant voltage with voltage on the vertical axis versus time on the horizontal axis. The notched waveform, 2906, shows where the notch is inserted for a DCC one versus a DCC zero; the dotted lines shows the timing marks where the notches are applied. At the same time at alternating timing locations, the microprocessor instructs the bridge rectifier to invert the waveform applied to the track to produce the notched DCC waveform, 2907, shown at the output of Active Bridge 2905.

The Voltage Drop Module, 2903, also contains a sense resistor, R, to produce a voltage drop in proportion to the track current during the time the notch is applied to the waveform. The resistor is sufficiently small to generate only a percentage of the total voltage drop from the dropping diodes. The voltage drop across the resistor, R, is sensed by the current sensing module, 2904, which may provide the functions of amplification, filtering, and analog to digital conversion to produce a signal appropriate for the microprocessor, 132. This may include separating the analog sound samples from embedded digital data from the remote objects calibrated loading described earlier. The sampled sounds are based on current samples generated by the remote objects on the layout and since these are analog values, all the current samples from different remote objects are summed in the resistor R. This means that this total current represents the simple sum of the sound samples for all remote objects that are connected to the DCC system. After these samples are processed to produce a continuous sound output, they can be delivered to the Sound Production modules 137, and 139 to be applied to speakers 138 and 140. In addition to the sounds sampled from the remote objects on the layout, sounds stored in the Microprocessor, Sound Data and Sound Processing Means, 132 can be added to the recovered sounds to produce extra effects such as cab chatter, dispatcher comments, common internal cab sounds, etc. In addition, the low base sounds not reproduced well in the remote object can be applied to super low base or subwoofer speakers, perhaps located under the layout. The recovered remote object sounds can also be filtered and modified to produce the more muffled sounds for what a locomotive engineer would hear from inside the cab. The cab sounds could also be transmitted back to the user headphones, 111, through transceiver 131 and 110. While the user interaction is shown here as happening through a wireless interface, that user interaction could also occur manually on unit 131. In the manual case, unit 131 and 133 would actually be part of a single unit and wireless connectivity would be absent.

The microprocessor generates the notch and polarity inverting timing for DCC command signals based on signals from the user through transceiver 133 from user walk-around throttle, from direct inputs from Train Control, 134, or from inputs from other sources through transceiver 131. These transceivers are shown to be radio linked but could be any kind of transceiver capable of receiving and/or transmitting digital or analog information.

Alternatives to Lenz Asymmetric Waveform Detection

Bernd Lenz has a patent for sending information to locomotives locally that is independent of the locomotive's address. Normally, any command to a locomotive has to be addressed to that locomotive or it must be a broadcast command sent to all locomotives simultaneously. It is not possible to send a local DCC command to a locomotive within an electrically isolated area since by definition, the same DCC signal is ubiquitous; it must be applied to all areas of the layout. This requirement is useful to prevent short circuits as a locomotive moves from one location to another across power districts. In addition, if the user wanted to use DCC to send a local command to a locomotive, he would need to know when that locomotive entered that specific locality and then send the command to that specific locomotive. This is doable but not very practical. So Lenz proposed a method of altering the symmetry of selected DCC bits or groups of bits to from an asymmetric waveform by selectively decreasing the voltage amplitude of DCC peak voltage by a series of diode drops. This method would allow a local transmitter to send data locally at a rate of one bit per DCC bit that could then be detected by the decoder independent of the DCC signal. A typical waveform is show in FIG. 30 where the asymmetric waveform is applied bit-by-bit.

The top waveform shows a typically DCC waveform, in this case a transmission of the byte (1,0,0,1,1,1,0,1) as indicated by the labels, 3001, at the bottom of the top diagram. The second waveform shows the same DCC being transmitted along with Lenz's asymmetric waveform modifications. Here we have assigned a digital "0" when the waveform for a single DCC bit is asymmetric and a digital "1" when the waveform for a single DCC bit is symmetric as indicated by the labels, 3002, at the top of the bottom diagram. Here a local digital byte (0,1,0,1,1,0,0,1) is different and independent of the example DCC byte.

The advantage of the Lenz system is detection. The problem with detecting voltage reliably is due to resistive loses along the track and in the locomotive pickups; the voltage can change abruptly due to poor pickups as the locomotive moves, particularly at slow speeds. Lenz's method looks at a measureable voltage difference between the two polarities of a DCC bit rather than specific voltage levels.

Other advantage of Lenz's method is that if a locomotive should straddle two adjacent blocks with different asymmetric waveforms, the method of using diodes to lower the voltage means that the higher voltage bit wins (sort of a wire OR) and while data may be lost, there is no short circuit.

A third advantage is that direction of the asymmetry does not matter since Lenz is only trying to detect if each DCC bit it is symmetric or not. So if a locomotive should move through a reverse loop which will flip the DCC waveform, the decoder will detect the same local data transmissions.

New Methods

A method that does not depend on the waveform asymmetry is shown in FIG. 31. The top waveform shows a typically DCC waveform, 3101, in this case a transmission of the byte (1,0,0,1,1,1,0,1), as indicated by the labels, 3102, at the top of the top diagram. The second waveform shows the same DCC waveform being transmitted along with modification in amplitude. It we assign a reduction in the DCC half bit amplitude as a digital zero and unmodified amplitude as a digital one, then the asymmetric waveform transmitter has sent the following 16 bits of digital information on the above waveform (0,1,1,0,0,1,0,1,1,0,0,1,0,0,1,0), as indicated by the labels, 3103, at the top of the top diagram.

We are proposing another method to do this that may actually be better. The idea is similar except that instead of lowering the voltage of the DCC amplitude, we would lower the voltage of the notch Drop amplitude. One advantage is that we do not have to carry the full track current for this voltage change. We can still use a series of diodes to lower the voltage but very little current is required. An example of a waveform using this method is shown in FIG. 32. The top waveform is the same DCC signal as the top waveform in FIG. 31. The second waveform, 3202, shows the notched version of the standard DCC waveform with the notch amplitude determined by the digital value of the local transmission. This is generating the same 16 bits of digital information (0,1,1,0,0,1,0,1,1,0,0,1,0,0,1,0) as before in FIG. 31, except the notch Drop magnitude is used to encode each bit. A large magnitude Drop in notch, indicated by dashed lies, 3203 and 3204, encodes a digital 0 while a smaller magnitude Drop in the notch, indicated by dashed lies, 3205 and 3205, encodes a digital 1, as indicated by the digital designation at each notch.

The Lenz patent actually describes a means to provide an asymmetric waveform to the track where the locomotive assigns a digital one or zero to each DCC bit depending on whether it is symmetric or asymmetric. Even though our signal is asymmetric, it is not what we detect. We look at each half bit and we are looking only at the applied voltage in the notch.

Another advantage is that this waveform does not affect the current detected for out bi-directional technology unless the low voltage level is below the voltage compliance of our current sinks.

A simple transmitter and receiver for this type of waveform is show in FIG. 33. The on-board bi-level notch receiver, 3301, in the locomotive is shown on the left and is an addition to the normal decoder or sound decoder, such as the examples in FIG. 5 and FIG. 10. The local bi-level notch transmitter, 3302, on the right shows an insertion loss block make up of four diode drops with a switch, 3303, across the diode block under control of the microprocessor1. The insertion loss diode block is in series between the DCC signal source, 3300, and the track connections. If the switch is closed, there is no additional voltage insertion loss. If the switch is open, there is a voltage drop of about 3 volts to the DCC signal that is applied to the local track block section. Note that the DCC signal that is applied to the local transmitter already includes volt notches.

Although the switch is shown as a simple relay, back-to-back FET's with opto-isolation control is also an option.

When the Q-Link sends a command packet addressed to the local bi-level notch transmitter's uP with commands to relay to any locomotive in the local block, the transmitter will applied an addition 3 volt drop to selected notches for transmitting a digital zero or apply no additional voltage drop to selected notches for transmitting a digital one. The outgoing DCC waveform, 3304, shows the third and fourth and the seventh and eight DCC half bits with the additional Drop in the notch. The added voltage drop is only applied to the notch and does not affect the DCC peak voltage value.

In order to ensure the transmitter applies the additional voltage drop only to the notch and not the DCC peak voltage, a rectifier and notch detector, 3305, is included. When a notch is detected, this information is relayed to the uP, 3306, which along the bi-level command from the Q-Link, 3307, will serially apply the voltage drop to selected notches to transmit the bi-level notch commands to the locomotive decoder.

The receiver includes additional rectifier diodes, 3308 and 3309, connected to the two track rails, with filter cap, 3309, to detect the peak DCC voltage signal. A series of dropping diodes, 3310, that applies a voltage midway between the peak DCC value and the first notch level is applied to the first comparator, 3314. When a notch of any level occurs, the notch detector will go high. This is shown in the third diagram in FIG. 34.

Additional diodes, 3311, apply a second voltage reference to the Notch Level comparator, 3313, that is half way between the two detected notch levels. If a first notch level occurs (bi-level digital one), then the detector output is high. If a second level occurs (bi-level digital zero), then the comparator goes low. The output of the comparator is shown in the fourth diagram in FIG. 34, called "Notch Level". To determine the bi-level digital value, the on-board microprocessor in the locomotive's decoder will detect the concurrence of the notch detection and the notch level. If both are high, then a bi-level digital "one" has occurred as shown in the fifth diagram; if the notch detection is high but the notch level is low, then a bi-level digital zero has occurred as shown in the sixth diagram.

A simple peak detector consisting of a full-wave bridge and filter capacitor is used to measure and hold the DCC peak value. A resistor, R, 3312, is included to provide current for the dropping diodes and also to bleed the capacitor charge to allow the detector to react to changing DCC peak voltage. The RC time constant is selected to make sure the peak value will react to the variability of the DCC signal due to power losses on the layout and to variation in pickup resistance. I would guess that we do not want the DCC peak value to drop less than two diodes drops during a stretch zero time interval of 12 mSec, which could be the time a notch might exist under this unusual circumstance. Assuming a high DCC voltage of 18 volts and two diode drops of 1.44 volts, the RC time constant would be about 0.143 Seconds. The diode current needs to be about 2 mA, so R needs to be about 10K. C would be about 22 of at 35 volts.

A third comparator, 3315, is included in the receiver to detect if the applied DCC voltage is lost. If this happens, then the on-board decoder's uP should consider all data that occurs during power loss as invalid, rather than an extended zero which is what the second bi-level comparator would mistakenly read. It should probably discard the preceding detected bit before power lost and the first bit of data after power is restored.

The low output from the third compactor, 3315, could also be used to alert the on-board decoder's uP that that any current sink bi-directional data is also invalid. Since the current detector at the base station is also aware that the bi-directional data is not present, the on-board uP could re-sink the same digital current data until both the locomotive and the base station agree that the data is finally valid.

The loss of power also means BackWave sound is not being polled as well. It may be possible at the command station to reconstruct or provide a continuation of the low frequency sound by replaying sound stored in the base station memory or some canned sound in memory that would at least continue to provide some base effects. We should assume that the lost power could be a long as 10 ms.

The effect of a period of lost DCC signal is shown in the set of diagrams in FIG. 35. If the lost signal is due to bad pickups on the locomotive then the DCC signal is still present on the track as shown in the top diagram, 3501, at time interval, 3508. The rectified DCC abruptly stops, as shown in the second diagram, 3502, and the valid data output from the third comparator goes low as shown in the third diagram, 3503. The notch detector, 3504, goes high during this period since any drop from the peak DCC level looks like a notch. The notch level, 3505, also goes low since having the rectified DCC go to zero appears to the second comparator as a second level digital signal. The effect of all this is that no bi-level digital ones are detected, 3506, and an extended zero is falsely detected, 3507.

It will be obvious to those having skill in the art that many changes may be made to the details of the above-described embodiments without departing from the underlying principles of the invention. The scope of the present invention should, therefore, be determined only by the following claims.

The invention claimed is:

1. A system for use in a model railroad locomotive, comprising:

first and second track nodes for electrical coupling to a model railroad layout track;

power supply means, coupled to the first and second track nodes and arranged to receive power from a Digital Command Control ("DCC") signal on the track, for supplying power to circuits on board the locomotive;

a microprocessor coupled to the power supply means, the microprocessor including or coupled to a memory storing sound data, and the microprocessor configured to read the sound data from the memory and generate digital sound samples responsive to the sound data;

a variable current sink coupled to the first and second track nodes and coupled to the microprocessor to sink current from the track in an amount responsive to the digital sound samples, thereby passively conveying sound information from the locomotive to the track for detection by a controller coupled to the track remote from the locomotive; and synchronization means coupled to the first and second track nodes to receive the DCC signal and coupled to the variable current sink for synchronizing the variable current sink to the DCC signal.

2. The system of claim 1 wherein the variable current sink comprises a digital-to-analog (DAC) circuit arranged to convert the digital sound samples to analog sink current values.

3. The system of claim 1 wherein synchronization means includes a DCC edge detector circuit and a DCC level detector circuit both coupled to a DCC sample detection circuit, the sample detection circuit arranged to trigger a timer circuit for integrating the digital sound samples.

4. The system of claim 1 wherein the variable current sink is calibrated according to a resolution of the onboard sound data.

5. The system of claim 1 wherein the system is configured to sink at least a minimum non-zero current from the track at all times that the system is operating.

6. The system of claim 1 wherein the synchronization means is configured to implement one current sink sample value for each half-cycle of the DCC signal.

7. The system of claim 1 wherein the synchronization means is configured to sink current from the track during a lowered voltage period of the DCC signal.

8. A system for use in a model railroad locomotive, comprising:

first and second track nodes for electrical coupling to a model railroad layout track;

power supply means, coupled to the first and second track nodes to receive power from a Digital Command Control ("DCC") signal on the track, for supplying power to circuits on board the locomotive;

a microprocessor coupled to the power supply means, the microprocessor including or coupled to a memory storing sound data, and the microprocessor configured to read the sound data from the memory and generate analog sample values responsive to the sound data;

a variable current sink coupled to the first and second track nodes and coupled to the microprocessor to sink current from the track in an amount responsive to the analog sample values, thereby conveying sound information from the locomotive to the track for detection by a controller coupled to the track remote from the locomotive; and synchronization means coupled to the first and second track nodes to receive the DCC signal and coupled to the variable current sink for synchronizing the variable current sink to the DCC signal.

9. The system of claim 8 wherein the variable current sink comprises a transistor.

10. The system of claim 8 wherein the synchronization means is configured to implement one current sink sample value for each half-cycle of the DCC signal.

11. The system of claim 8 wherein the synchronization means is configured to sink current from the track during a lowered voltage period of the DCC signal.

12. A method for audio sound effects in a model railroad layout having multiple locomotives, the method comprising:

at a control system coupled to a track of the model railroad layout, generating a Digital Command Control ("DCC") signal on the track;

wherein the DCC signal comprises digital packets, each packet having a packet header that includes an address of a selected locomotive on the model railroad layout, so that the control system can be used to control each of the multiple locomotives on the layout;

at the control system, monitoring the track to detect sink currents on the DCC signal;

at the control system, synchronizing the monitoring step to the DCC signal by measuring the detected sink currents at predetermined times relative to the DCC signal, whereby at each predetermined time, the measured sink current will be substantially equal to a sum of individual sink currents that are applied to the track by the multiple locomotives;

at the control system, converting each of the measured sink current to a sample voltage;

at the control system, reconstructing an audio sound signal responsive to the sample voltages; and at the control system, providing the reconstructed audio sound signal to drive at least one speaker, thereby reproducing audio sounds responsive to all of the multiple locomotives that provide sound information by synchronously sinking current from the DCC signal on the track.

* * * * *